US012266663B2

(12) United States Patent
Zhao et al.

(10) Patent No.: US 12,266,663 B2
(45) Date of Patent: Apr. 1, 2025

(54) DISPLAY PANEL HAVING A BONDING REGION

(71) Applicants: Chengdu BOE Optoelectronics Technology Co., Ltd., Sichuan (CN); BOE Technology Group Co., Ltd., Beijing (CN)

(72) Inventors: Pan Zhao, Beijing (CN); Zhiliang Jiang, Beijing (CN); Haigang Qing, Beijing (CN); Shilong Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/786,578

(22) PCT Filed: Aug. 17, 2021

(86) PCT No.: PCT/CN2021/112967
§ 371 (c)(1),
(2) Date: Jun. 17, 2022

(87) PCT Pub. No.: WO2023/019425
PCT Pub. Date: Feb. 23, 2023

(65) Prior Publication Data
US 2024/0297182 A1    Sep. 5, 2024

(51) Int. Cl.
*H01L 27/12*    (2006.01)
*G06F 3/044*    (2006.01)

(52) U.S. Cl.
CPC ........ *H01L 27/1244* (2013.01); *G06F 3/0443* (2019.05)

(58) Field of Classification Search
None
See application file for complete search history.

(56) References Cited

U.S. PATENT DOCUMENTS

2021/0212213 A1    7/2021  Tong
2021/0271143 A1    9/2021  Yang

FOREIGN PATENT DOCUMENTS

CN    206098393 U         4/2017
CN    105513499 B   *    3/2018    ....... G02F 1/133305
(Continued)

OTHER PUBLICATIONS

International Search Report & Written Opinion mailed May 5, 2022, regarding PCT/CN2021/112967.

*Primary Examiner* — Duane N Taylor, Jr.
(74) *Attorney, Agent, or Firm* — Intellectual Valley Law, P.C.

(57) ABSTRACT

A display panel having a bonding region for bonding an integrated circuit is provided. The display panel includes a base substrate; and a plurality of bonding pin structures on the base substrate arranged in a plurality of columns, respectively. A respective bonding pin structure includes a respective bonding pin and connection lines on two ends of the respective bonding pin, respectively. Bonding pins of the plurality of bonding pin structures are arranged in N rows, N is a positive integer equal to or greater than 4. (N−1) number of connection lines pass through a region between two adjacent bonding pins arranged in a same row.

20 Claims, 25 Drawing Sheets

(56) References Cited

FOREIGN PATENT DOCUMENTS

| | | | | | |
|---|---|---|---|---|---|
| CN | 108878679 | A | | 11/2018 | |
| CN | 106291999 | B | * | 7/2019 | ........... G02F 1/1309 |
| CN | 110133924 | A | * | 8/2019 | ......... G02F 1/13306 |
| CN | 106908975 | B | * | 8/2020 | ......... G02F 1/13338 |
| CN | 112748613 | A | | 5/2021 | |
| JP | 2011222901 | A | | 11/2011 | |
| WO | 2020232690 | A1 | | 11/2020 | |

\* cited by examiner

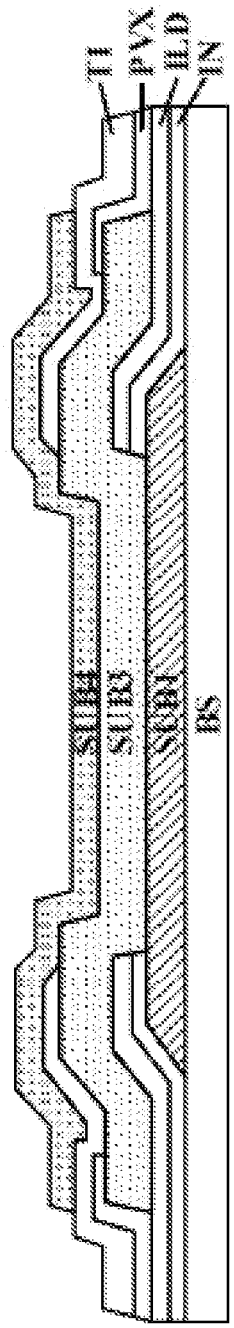
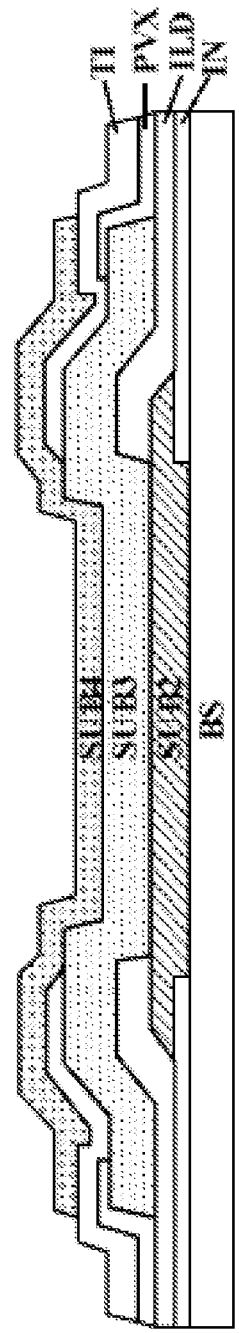
FIG. 5A
FIG. 5B

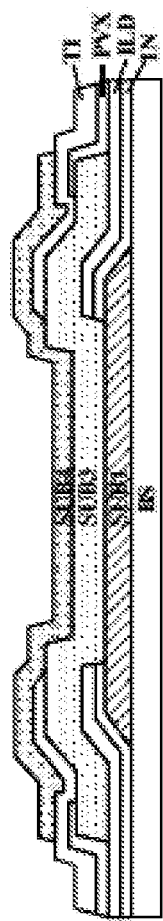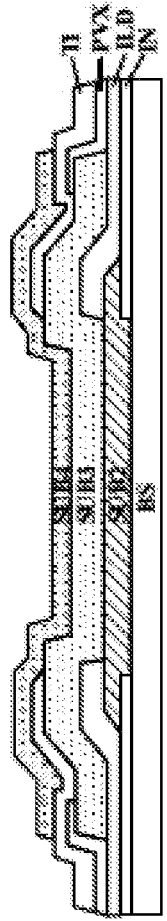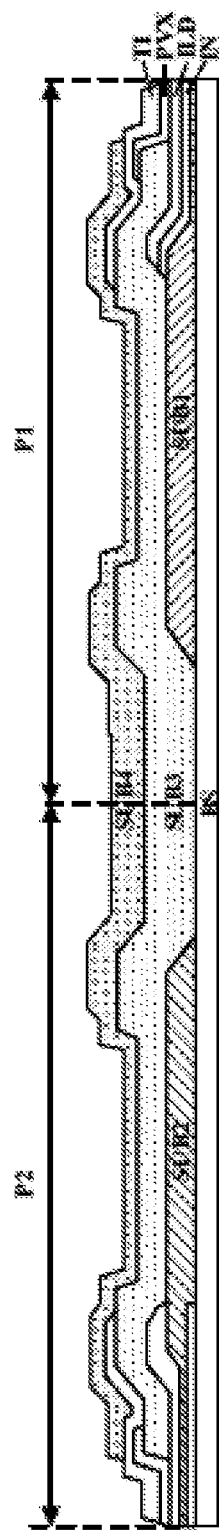

DISPLAY PANEL HAVING A BONDING REGION

CROSS-REFERENCE TO RELATED APPLICATION

This application is a national stage application under 35 U.S.C. § 371 of International Application No. PCT/CN2021/112967, filed Aug. 17, 2021, the contents of which are incorporated by reference in the entirety.

The present invention relates to display technology, more particularly, to a display panel having a bonding region.

BACKGROUND

Display apparatus inside one or more integrated circuits bonded to a bonding region in the display apparatus for driving image display and touch control. Integrated circuits are costly to fabricated.

SUMMARY

In one aspect, the present disclosure provides a display panel, having a bonding region for bonding an integrated circuit, comprising a base substrate; and a plurality of bonding pin structures on the base substrate arranged in a plurality of columns, respectively; wherein a respective bonding pin structure comprises a respective bonding pin and connection lines on two ends of the respective bonding pin, respectively; bonding pins of the plurality of bonding pin structures are arranged in N rows, N is a positive integer equal to or greater than 4; and (N−1) number of connection lines pass through a region between two adjacent bonding pins arranged in a same row.

Optionally, at least two adjacent connection lines of the (N−1) number of connection lines between the two adjacent bonding pins arranged in a same row are in two different layers.

Optionally, the two adjacent connection lines are in a first conductive layer and a second conductive layer, respectively; and the display panel further comprising an insulating layer between the first conductive layer and the second conductive layer.

Optionally, the (N−1) member of connection lines between the two adjacent bonding pins arranged in a same row are alternately in the first conductive layer and the second conductive layer.

Optionally, in a x1-th row of the N rows, a first group of (N−1) number of connection lines pass through a region between two adjacent bonding pins arranged in the x1-th row, $1 \leq x1 \leq N$, x1 being an integer, in a x2-th row of the N rows, a second group of (N−1) number of connection lines pass through a region between two adjacent bonding pins arranged in the x2-th row, $1 \leq x \leq N$, x2 being an integer different from x1; the (N−1) number of connection lines in the first group are alternately in a first conductive layer and a second conductive layer, with a first connection line in the first group being in the first conductive layer; the (N−1) number of connection lines in the second group are alternately in the first conductive layer and the second conductive layer, with a first connection line in the second group being in the second conductive layer, and x2=x1+1, or x1=x2+1.

Optionally, in at least a x-th row of the N rows, a x-th row bonding pin comprises at least a first sub-layer, $1 \leq x \leq N$, x being an integer; in at least a y-th row of the N rows, a y-th row bonding pin comprises at least a second sub-layer, $1 \leq y \leq N$, y being an integer different from x; the second sub-layer is absent in the x-th row bonding pin; the first sub-layer is absent in the y-th row bonding pin; the first sub-layer and the second sub-layer are in a first conductive layer and a second conductive layer, respectively; and the display panel further comprises an insulating layer between the first conductive layer and the second conductive layer.

Optionally, the x-th row and the y-th row are two adjacent rows.

Optionally, in at least a z-th row, a z-th row bonding pin comprises a first portion and a second portion along an extension direction of the z-th row bonding pin, $1 \leq z \leq N$, z being an integer; the first portion comprises at least a first sub-layer, the second portion comprises at least a second sub-layer, the second sub-layer is absent in the first portion; the first sub-layer is absent in the second portion; the first sub-layer and the second sub-layer are in a first conductive layer and a second conductive layer, respectively; and the display panel further comprises an insulating layer between the first conductive layer and the second conductive layer.

Optionally, the z-th row bonding pin further comprises at least a third sub-layer in both the first portion and the second portion; wherein the third sub-layer connects the first sub-layer in the first portion to the second sub-layer in the second portion; the third sub-layer is in a first signal line layer; and the display panel further comprising an inter-layer dielectric layer between the second conductive layer and the first signal line layer.

Optionally, the z-th row bonding pin further comprises a fourth sub-layer in both the first portion and the second portion; wherein the fourth sub-layer is on a side of the third sub-layer away from the first sub-layer and the second sub-layer, the fourth sub-layer being in contact with the third sub-layer; the fourth sub-layer is in a touch electrode layer; and the display panel further comprising at least a touch insulating layer between the touch electrode layer and the first signal line layer.

Optionally, the z-th row is a row other than a first row and a N-th row.

Optionally, in at least a z-th row, a z-th row bonding pin comprises a first portion and a second portion along an extension direction of the z-th row bonding pin, $1 \leq z \leq N$, z being an integer; in a first adjacent row, a first adjacent row bonding pin comprises at least a first adjacent portion adjacent to the first portion; in a second adjacent row, a second adjacent row bonding pin comprises at least a second adjacent portion adjacent to the second portion; the first portion is in a same layer as the first adjacent portion and in a different layer from the second portion and the second adjacent portion; and the second portion is in a same layer as the second adjacent portion and in a different layer from the first portion and the first adjacent portion.

Optionally, N is an even number, in a group of (N−1) number of connection lines between two adjacent i-th row bonding pins in a i-th row of the N rows, a first connection line and a (N−1)-th connection line are in a same layer, $1 \leq i \leq N$, i being an integer, and the two adjacent i-th row bonding pins comprise a sub-layer in a different layer from the first connection line and the (N−1)-th connection line, and in a same layer as a second connection line or a (N−2)-th connection line.

Optionally, N is an odd number, in a group of (N−1) number of connection lines between two adjacent i-th row bonding pins in a i-th row of the N rows, a first connection line and a (N−1)-th connection line are in different layers, $1 \leq i \leq N$, i being an integer.

Optionally, i=1 or i=N.

Optionally, in at least a z-th row, a z-th row bonding pin comprises a first portion and a second portion along an extension direction of the z-th row bonding pin, 1≤z≤N, z being an integer, and in a group of (N−1) number of connection lines between two adjacent z-th row bonding pins in the z-th row, a first connection line and a (N−1)-th connection line are in different layers.

Optionally, the first connection line is in a same layer as the first portion and in a different layer from the second portion and the (N−1)-th connection line; and the (N−1)-th connection line is in a same layer as the second portion and in a different layer from the first portion and the first connection line.

Optionally, the first connection line is in a same layer as the second portion and in a different layer from the first portion and the (N−1)-th connection line; and the (N−1)-th connection line is in a same layer as the first portion and in a different layer from the second portion and the first connection line.

Optionally, N=5.

In another aspect, the present disclosure provides a display apparatus, comprising the display panel described herein or fabricated by a method described herein, and one or more integrated circuit bonded to the plurality of bonding pin structures in the bonding region of the display panel.

BRIEF DESCRIPTION OF THE FIGURES

The following drawings are merely examples for illustrative purposes according to various disclosed embodiments and are not intended to limit the scope of the present invention.

FIG. 5A is a cross-sectional view along an A-A' line in FIG. 2A.

FIG. 5B is a cross-sectional view along a B-B' line in FIG. 2A.

FIG. 6A is a cross-sectional view along a C-C' line in FIG. 3A.

FIG. 6B is a cross-sectional view along a D-D' line in FIG. 3A.

FIG. 6C is a cross-sectional view along a E-E' line in FIG. 3A.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display panel, having a bonding region that substantially obviate one or more of the problems due to limitations and disadvantages of the related art. In one aspect, the present disclosure provides a display panel having a bonding region for bonding an integrated circuit. In some embodiments, the display panel includes a base substrate; and a plurality of bonding pin structures on the base substrate arranged in a plurality of columns, respectively. Optionally, a respective bonding pin structure comprises a respective bonding pin and connection lines on two ends of the respective bonding pin, respectively. Optionally, bonding pins of the plurality of bonding pin structures are arranged in N rows. N is a positive integer equal to or greater than 4. Optionally, (N−1) number of connection lines pass through a region between two adjacent bonding pins arranged in a same row. In the present display panel, connection lines and at least certain sub-layers of certain bonding pins are arranged in two different layers, effectively obviating short between adjacent connection lines and between connection line and bonding pin. The layout of the bonding pin structures in the present display panel effectively allows a higher density of bonding pins and connection lines to be arranged in a same unit area, thus reducing a total number of integrated circuits needed for the display panel.

Figure 1:
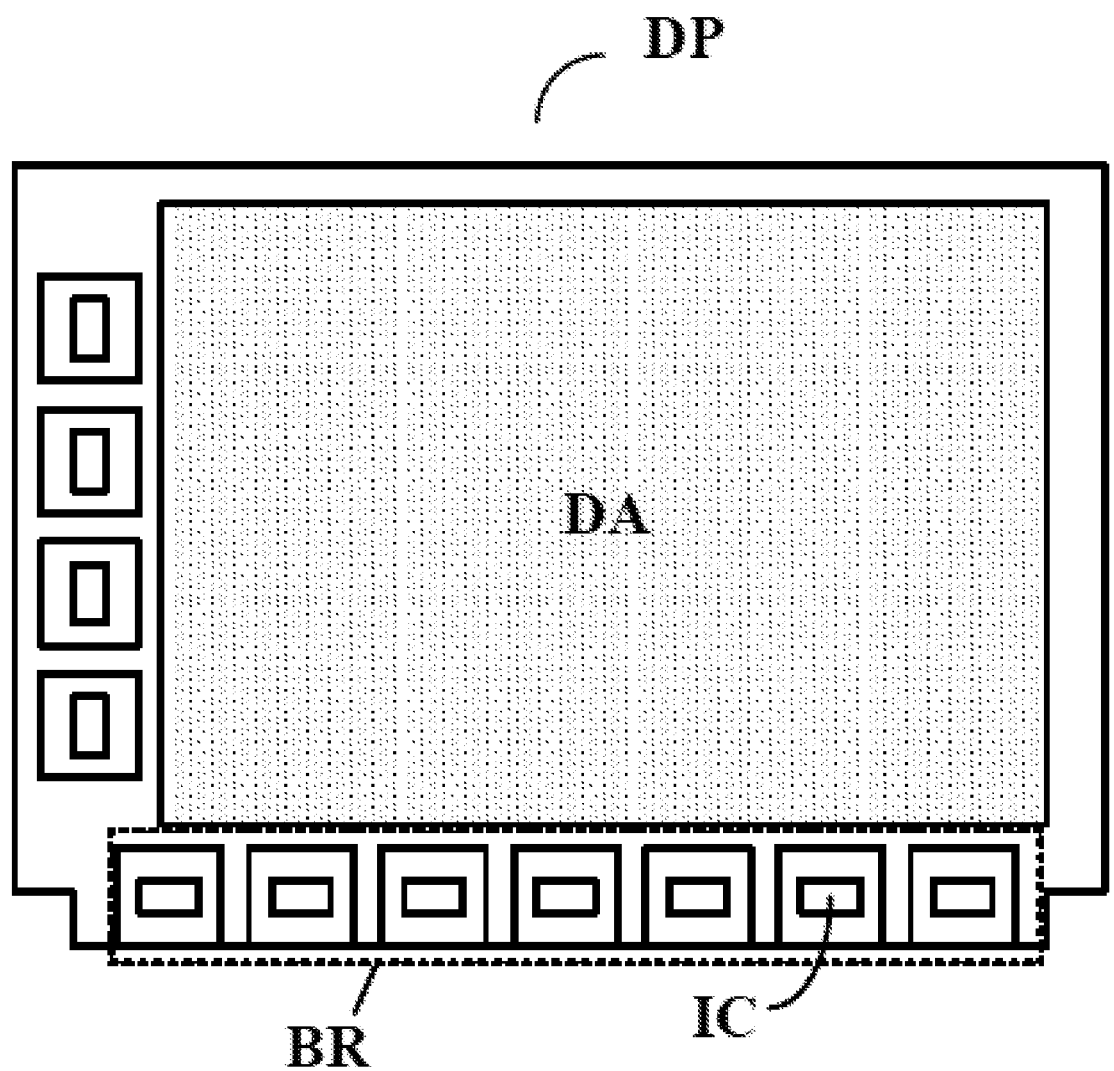
FIG. 1 is a schematic diagram of a display panel in some embodiments of the present disclosure.

FIG. 1 is a schematic diagram of a display panel in some embodiments of the present disclosure. Referring to FIG. 1, the display panel includes one or more integrated circuits IC bonded to the display panel in a bonding region BR of the display panel DP.

Figure 2A:
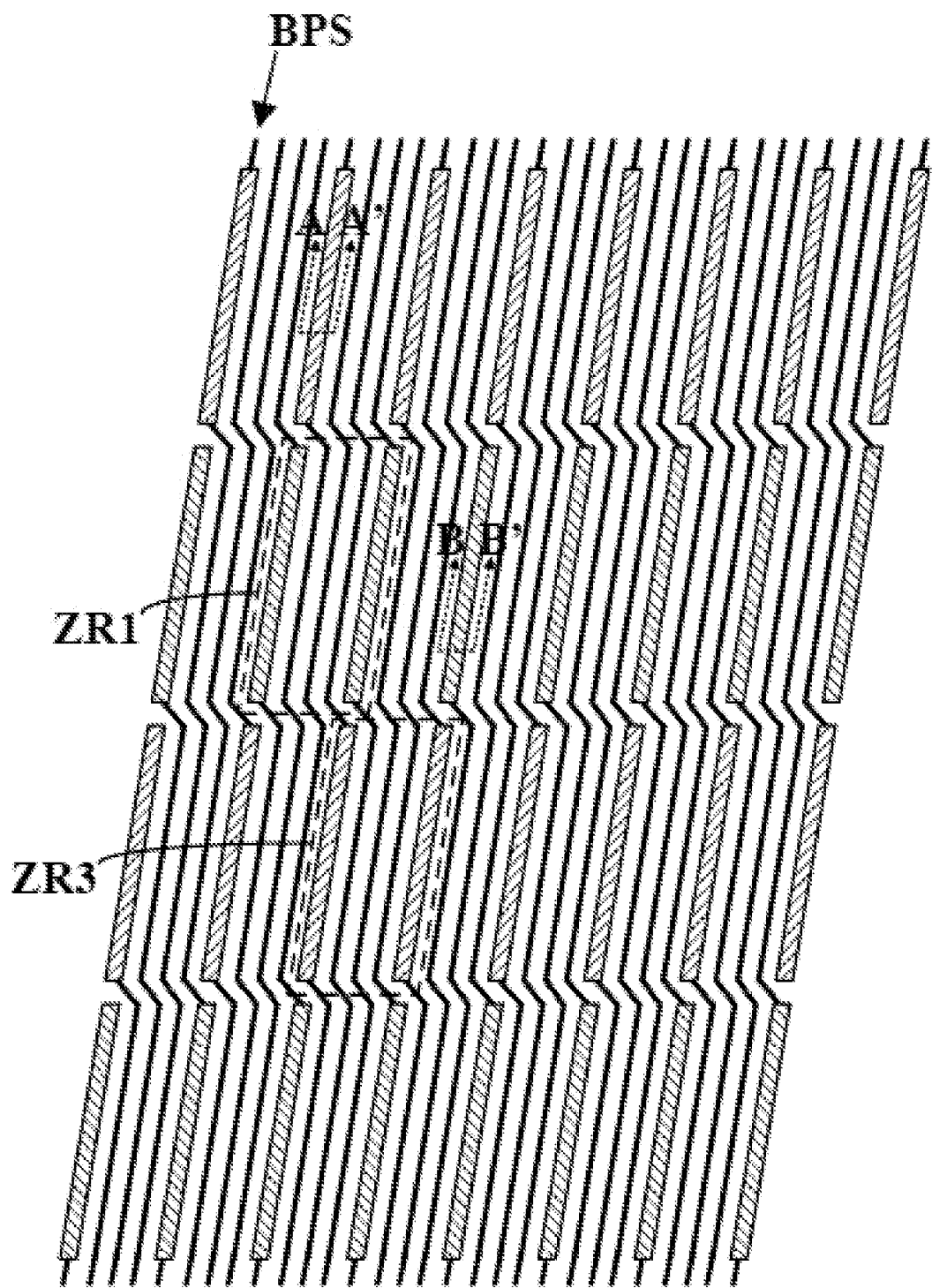
FIG. 2A is a schematic diagram of a plurality of bonding pin structures in a bonding region of a display panel in some embodiments of the present disclosure.
Figure 2B:
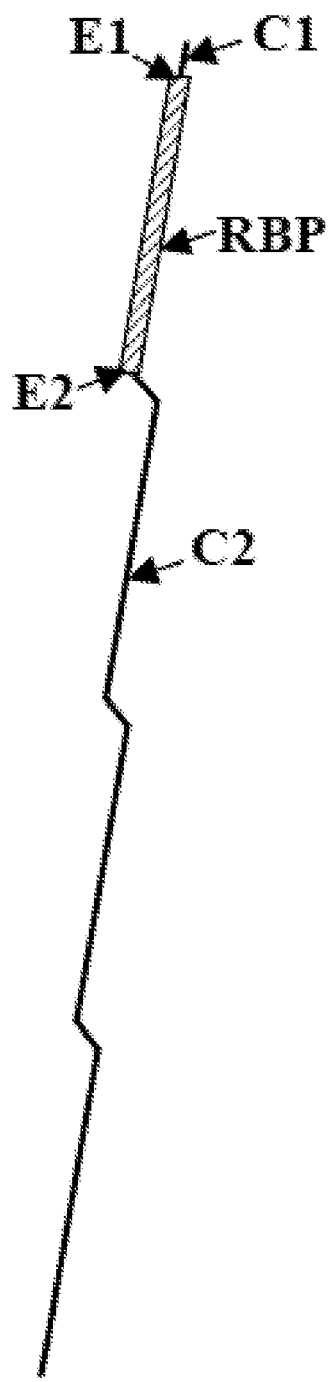
FIG. 2B is a schematic diagram of a bonding pin structure in some embodiments of the present disclosure.

FIG. 2A is a schematic diagram of a plurality of bonding pin structures in a bonding region of a display panel in some embodiments of the present disclosure. Referring to FIG. 2A, the plurality of bonding pin structures BPS are arranged in a plurality of columns, respectively. FIG. 2B is a schematic diagram of a bonding pin structure in some embodiments of the present disclosure. Referring to FIG. 2B, a respective bonding pin structure includes a respective bonding pin RBP and connection lines (e.g., C1 and C2) on two ends (e.g., E1 and E2) of the respective bonding pin RBP, respectively.

Figure 3A:
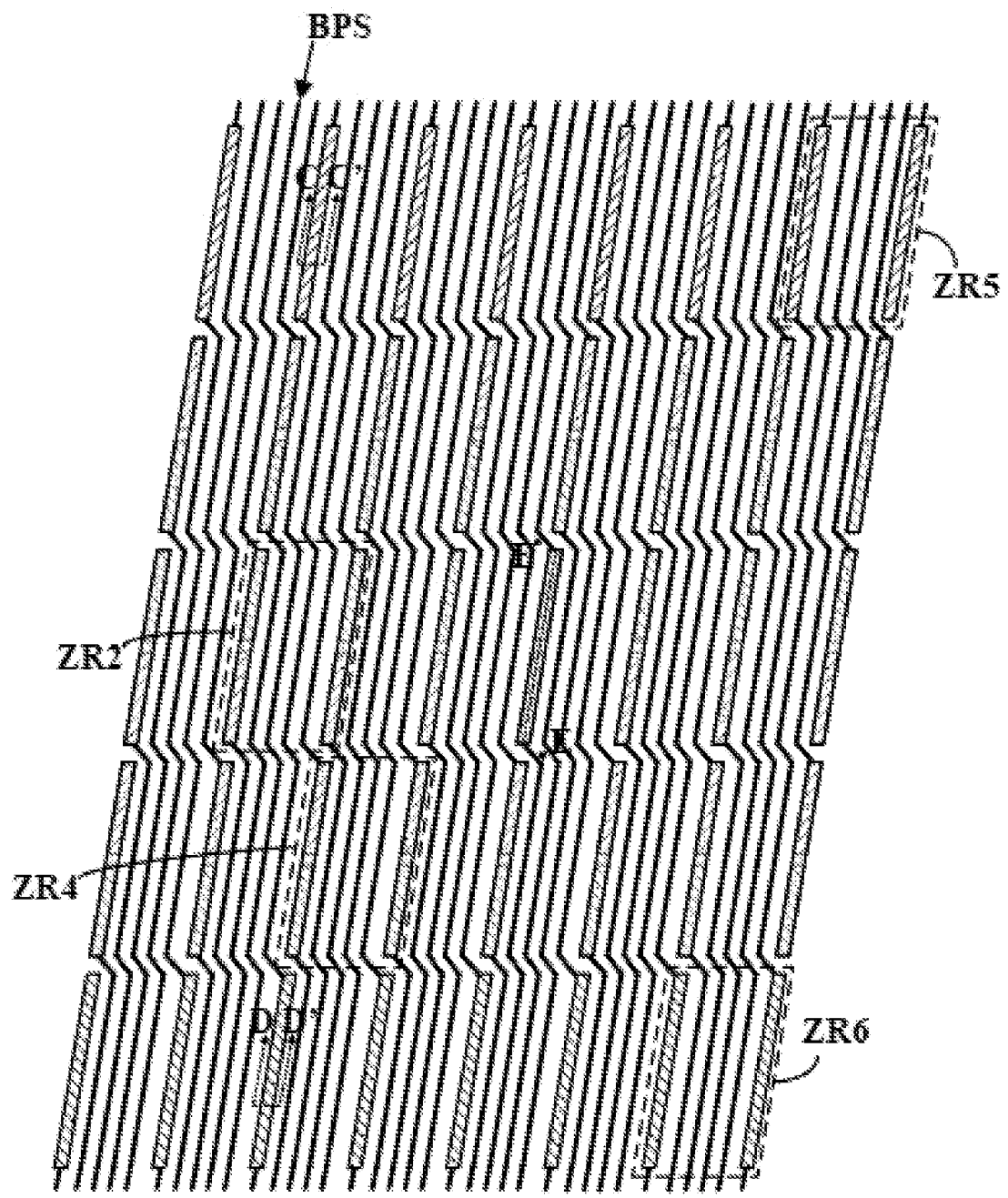
FIG. 3A is a schematic diagram of a plurality of bonding pin structures in a bonding region of a display panel in some embodiments of the present disclosure.
Figure 3B:
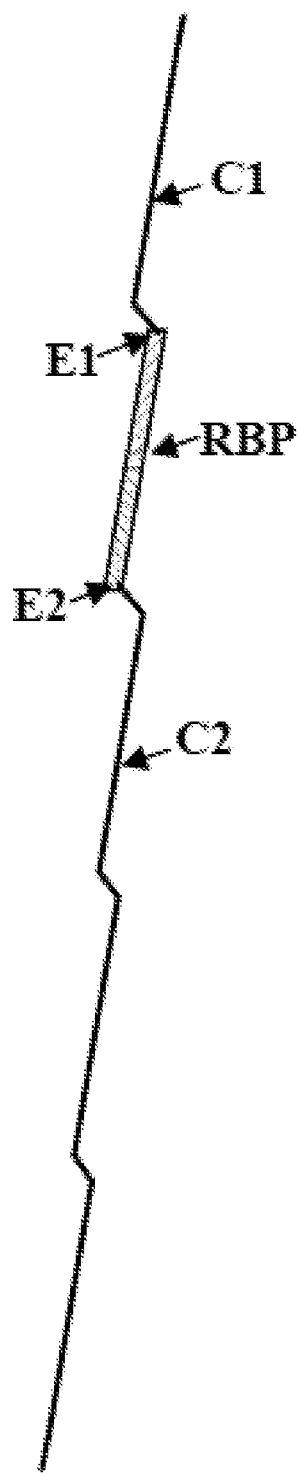
FIG. 3B is a schematic diagram of a bonding pin structure in some embodiments of the present disclosure.

FIG. 3A is a schematic diagram of a plurality of bonding pin structures in a bonding region of a display panel in some embodiments of the present disclosure. Referring to FIG. 3A, the plurality of bonding pin structures BPS are arranged in a plurality of columns, respectively. FIG. 3B is a schematic diagram of a bonding pin structure in some embodiments of the present disclosure. Referring to FIG. 3B, a respective bonding pin structure includes a respective bonding pin RBP and connection lines (e.g., C1 and C2) on two ends (e.g., E1 and E2) of the respective bonding pin RBP, respectively.

In some embodiments, bonding pins of the plurality of bonding pin structures BPS are arranged in N rows. N is a positive integer equal to or greater than 4, e.g., 4, 5, 6, 7, 8, 9, or 10. Referring to FIG. 2A, in one example, N=4. Referring to FIG. 3A, in another example, N=5.

Figure 2C:
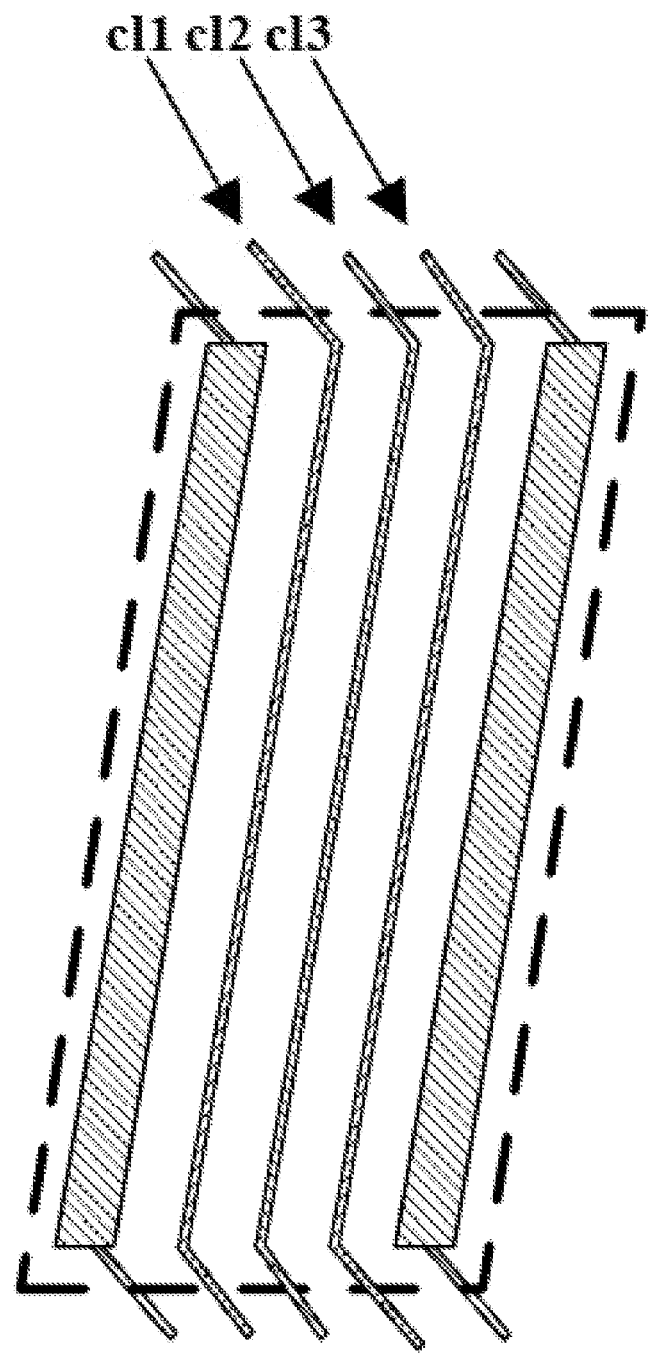
FIG. 2C is a zoom-in view of a first zoom-in region ZR1 in FIG. 2A.
Figure 3C:
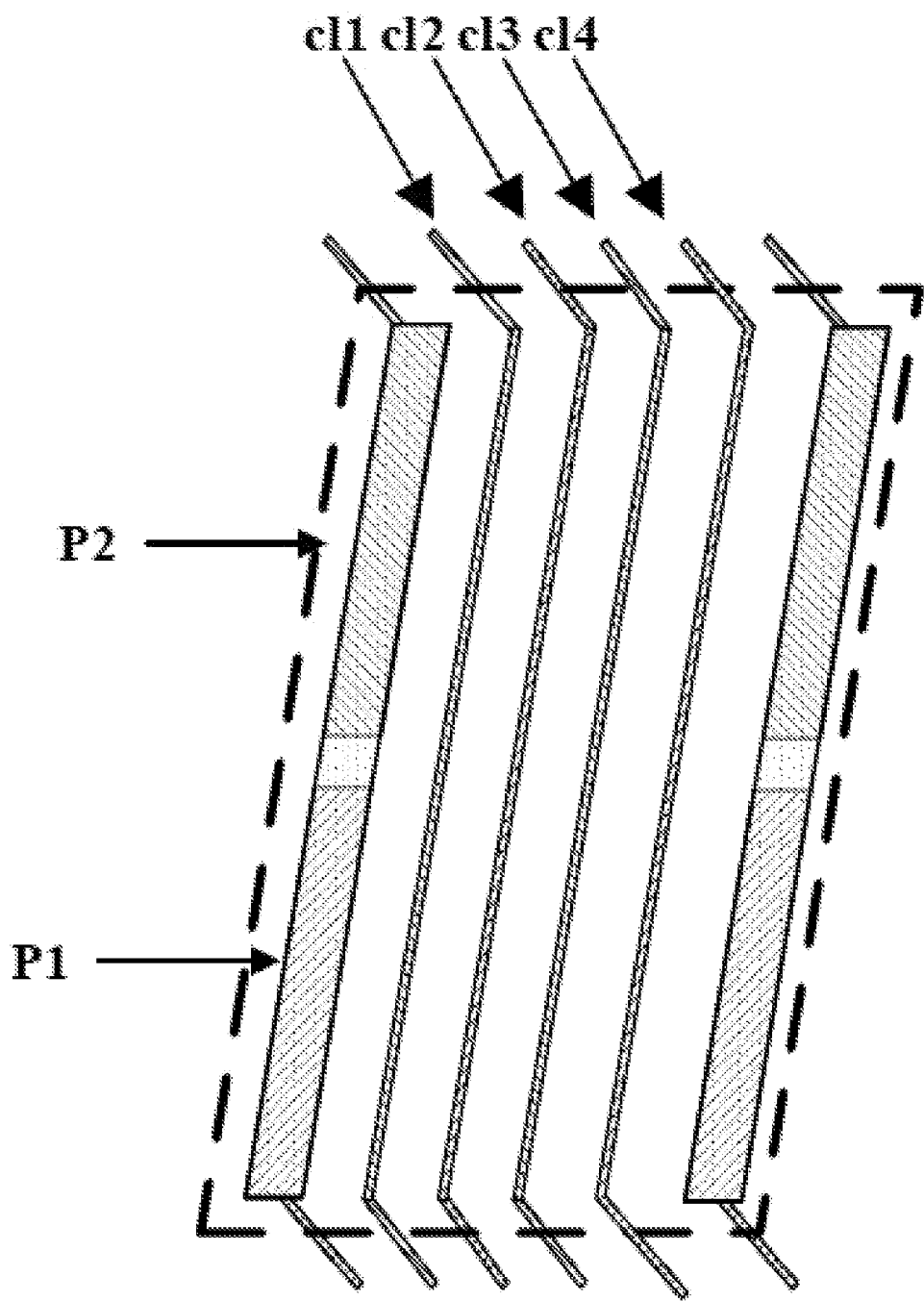
FIG. 3C is a zoom-in view of a second zoom-in region ZR2 in FIG. 3A.

In some embodiments, (N−1) number of connection lines pass through a region between two adjacent bonding pins arranged in a same row. FIG. 2C is a zoom-in view of a first zoom-in region ZR1 in FIG. 2A. Referring to FIG. 2A and FIG. 2C, bonding pins of the plurality of bonding pin structures BPS are arranged in 4 rows, and 3 connection lines pass through a region between any two adjacent bonding pins arranged in a same row. FIG. 3C is a zoom-in view of a second zoom-in region ZR2 in FIG. 3A. Referring to FIG. 3A and FIG. 3C, bonding pins of the plurality of bonding pin structures BPS are arranged in 5 rows, and 4 connection lines pass through a region between any two adjacent bonding pins arranged in a same row.

In some embodiments, at least two adjacent connection lines of the (N−1) number of connection lines between the two adjacent bonding pins arranged in a same row are in two different layers. Optionally, any pair of two adjacent connection lines of the (N−1) number of connection lines between the two adjacent bonding pins arranged in a same row are in two different layers. Referring to FIG. 2C, in one example, connection line cl1 and connection line cl2 are in different layers; and connection line cl2 and connection line cl3 are in different layers. Moreover, connection line cl1 and connection line cl3 are in a same layer.

Referring to FIG. 3C, in another example, connection line cl1 and connection line cl2 are in different layers; connection line cl2 and connection line cl3 are in different layers; and connection line cl3 and connection line cl4 are in different layers. Moreover, connection line cl1 and connection line cl3 are in a same layer; and connection line cl2 and connection line cl4 are in a same layer.

Figure 4A:
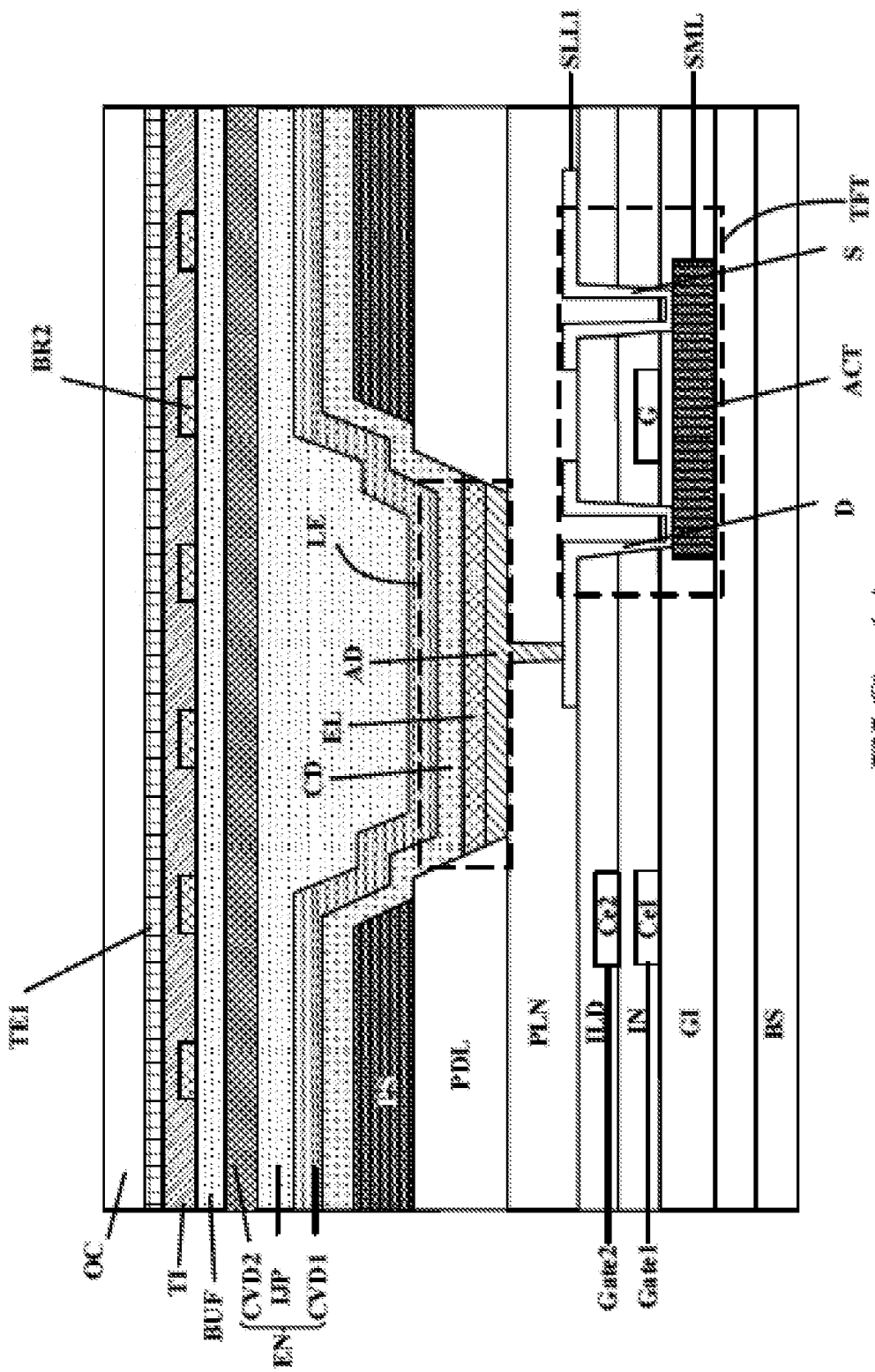
FIG. 4A illustrates a detailed structure in a display region in a display panel in some embodiments according to the present disclosure.

Referring to FIG. 1, the display panel has a display area DA where an image is displayed. Various implementations of the present display panel may be practiced. FIG. 4A illustrates a detailed structure in a display region in a display panel in some embodiments according to the present disclosure. Referring to FIG. 4A, the display panel in the display region in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first gate metal layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second gate metal layer) on a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first SD metal layer) on a side of the inter-layer dielectric layer ILD away from the gate insulating layer GI; a planarization layer PLN on a side of the source electrode S and the drain electrode D away from the inter-layer dielectric layer ILD; a pixel definition layer PDL defining a subpixel aperture and on a side of the planarization layer PLN away from the base substrate BS; and a light emitting element LE in the subpixel aperture. The light emitting element LE includes an anode AD on a side of the planarization layer PLN away from the inter-layer dielectric layer ILD; a light emitting layer EL on a side of the anode AD away from the planarization layer PLN; and a cathode layer CD on a side of the light emitting layer EL away from the anode AD. The display panel in the display region further includes an encapsulating layer EN encapsulating the dummy light emitting element DLE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The display panel in the display region further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI.

Figure 4B:
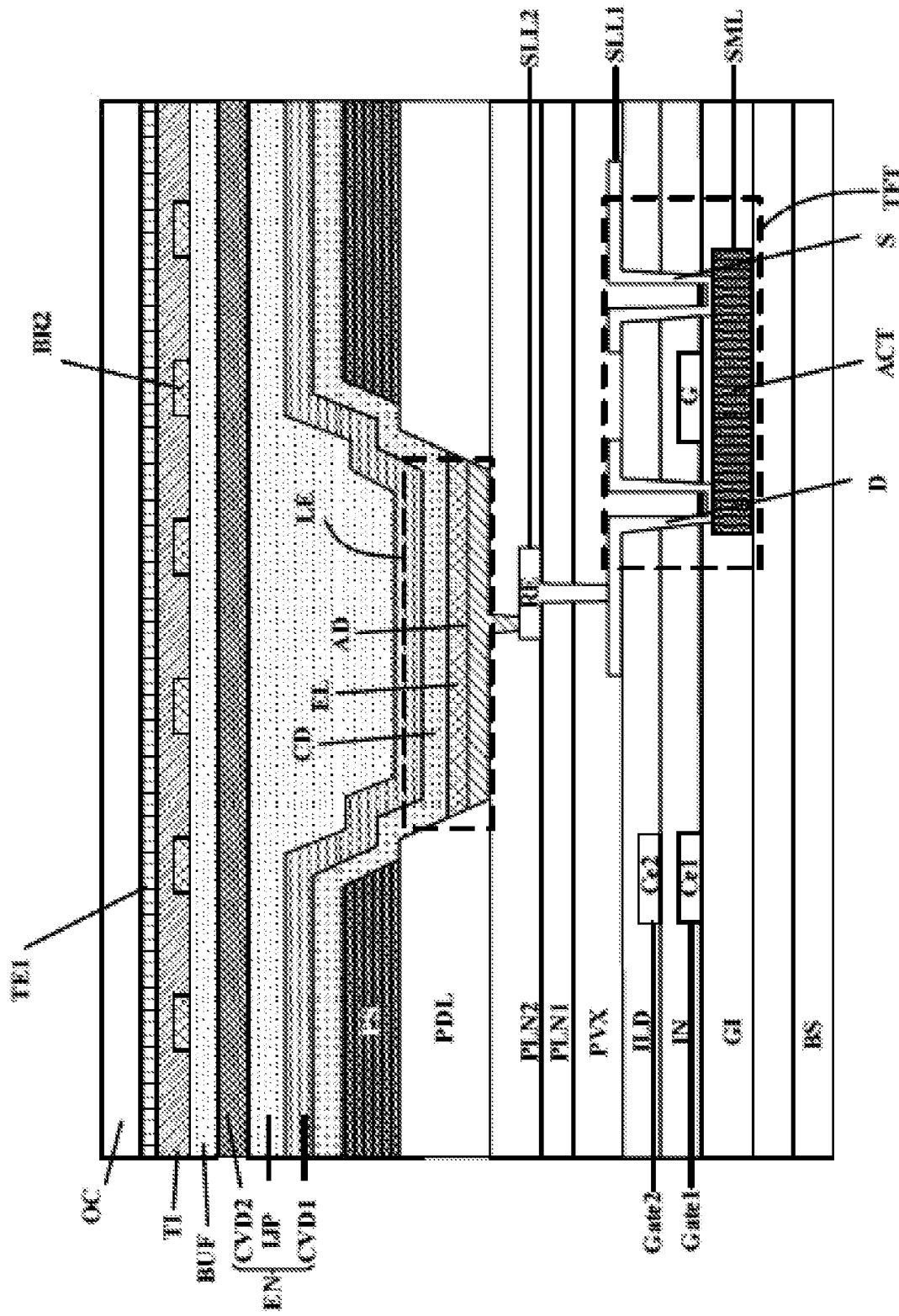
FIG. 4B illustrates a detailed structure in a display region in a display panel in some embodiments according to the present disclosure.

FIG. 4B illustrates a detailed structure in a display region in a display panel in some embodiments according to the present disclosure. Referring to FIG. 4B, the display panel in the display region in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first gate metal layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second gate metal layer) on a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first SD metal layer) on a side of the inter-layer dielectric layer ILD away from the gate insulating layer GL; a passivation layer PVX on a side of the source electrode S and the drain electrode D away from the inter-layer dielectric layer ILD; a first planarization layer PLN1 on a side of the passivation layer PVX away from the inter-layer dielectric layer ILD; a second planarization layer PLN2 on side of the first planarization layer PLN1 away from the passivation layer PVX; a relay electrode RE (part of a second SD metal layer) on a side of the second planarization layer PLN2 away from the first planarization layer PLN1; a pixel definition layer PDL defining a subpixel aperture and on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The display panel in the display region further includes an encapsulating layer EN encapsulating the dummy light emitting element DLE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer UP on a side of the first inorganic encapsulating sub-layer CVD1 away from the base substrate BS, and a second inorganic encapsulating sub-layer CVD2 on a side of the organic encapsulating sub-layer UP away from the first inorganic encapsulating sub-layer CVD1. The display panel in the display region further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI. Optionally, the display panel in the display region does not include the passivation layer PVX, e.g., the inter-layer dielectric layer ILD is in direct contact with the first planarization layer PLN1.

Referring to FIG. 4A and FIG. 4B, the display panel includes a semiconductor material layer SML, a first conductive layer Gate1, a second conductive layer Gate2, a first signal line layer SLL1, and a second signal line layer SLL2. The display panel further includes an insulating layer IN between the first conductive layer Gate1 and the second conductive layer Gate2; an inter-layer dielectric layer ILD between the second conductive layer Gate2 and the first signal line layer SLL1; and at least a passivation layer PVX or a planarization layer PLN between the first signal line layer SLL1 and the second signal line layer SLL2.

Referring to FIG. 2C, FIG. 3C, FIG. 4A, and FIG. 4B, in some embodiments, the two adjacent connection lines are in a first conductive layer Gate1 and a second conductive layer Gate2, respectively. The display panel further includes an insulating layer IN between the first conductive layer Gate1 and the second conductive layer Gate2. In one example, referring to FIG. 2C, FIG. 4A, and FIG. 4B, connection line cl1 is in the first conductive layer Gate1, connection line cl2 is in the second conductive layer Gate2, and connection line cl3 is in the first conductive layer Gate1. In another example, referring to FIG. 3C, FIG. 4A, and FIG. 4B, connection line cl1 is in the second conductive layer Gate2, connection line cl2 is in the first conductive layer Gate1, connection line cl3 is in the second conductive layer Gate2, and connection line cl4 is in the first conductive layer Gate1.

In some embodiments, the (N−1) number of connection lines between the two adjacent bonding pins arranged in a same row are alternately in the first conductive layer and the second conductive layer. In one example, referring to FIG. 2C, FIG. 4A, and FIG. 4B, connection line cl1, connection line cl2, and connection line cl3 are connection lines between the two adjacent bonding pins arranged in a same row, and are alternately in the first conductive layer Gate1 and the second conductive layer Gate2. In another example, referring to FIG. 3C, FIG. 4A, and FIG. 4B, connection line cl1, connection line cl2, connection line cl3, and connection line cl4 are connection lines between the two adjacent bonding pins arranged in a same row, and are alternately in the first conductive layer Gate1 and the second conductive layer Gate2.

In some embodiments, in a x1-th row of the N rows, a first group of (N−1) number of connection lines pass through a region between two adjacent bonding pins arranged in the x1-th row, $1 \leq x1 \leq N$, x1 being an integer. In a x2-th row of the N rows, a second group of (N−1) number of connection lines pass through a region between two adjacent bonding pins arranged in the x2-th row, $1 \leq x2 \leq N$, x2 being an integer different from x1. The (N−1) number of connection lines in the first group are alternately in a first conductive layer and a second conductive layer, with a first connection line in the first group being in the first conductive layer. The (N−1) number of connection lines in the second group are alternately in the first conductive layer and the second conductive layer, with a first connection line in the second group being in the second conductive layer. Optionally, $x2=x1+1$, or $x1=x2+1$.

Figure 2D:
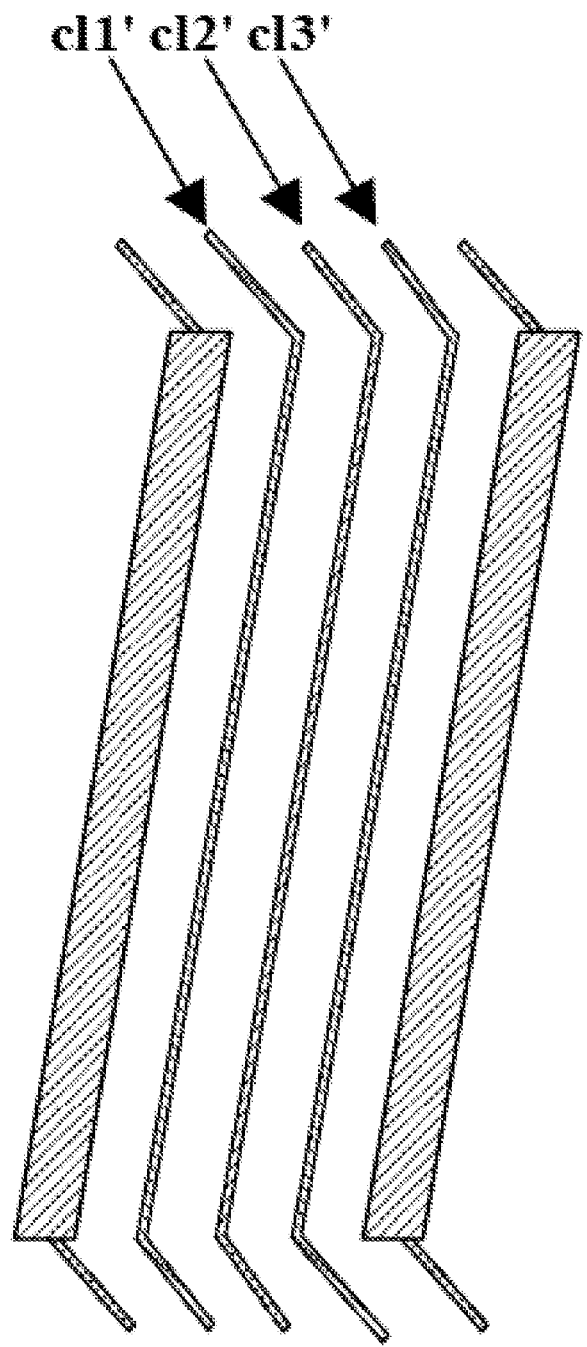
FIG. 2D is a zoom-in view of a third zoom-in region ZR3 in FIG. 2A.

FIG. 2D is a zoom-in view of a third zoom-in region ZR3 in FIG. 2A. Referring to FIG. 2C, FIG. 2D, FIG. 4A, and FIG. 4B, in some embodiments, the first zoom-in region ZR1 is in a x1 row (e.g., a second row), and the third zoom-in region ZR3 is in a x2 row (e.g., a third row), $x2=x1+1$. In the x1-th row (e.g., the second row) of the N rows, a first group of (N−1) number of connection lines (connection lines cl1, cl2, and cl3) pass through a region between two adjacent bonding pins arranged in the x1-th row. Connection lines cl1, cl2, and cl3 in the first group are alternately in a first conductive layer and a second conductive layer, with a first connection line (connection line cl1) in the first group being in the first conductive layer Gate1. In the x2-th row (e.g., the third row) of the N rows, a second group of (N−1) number of connection lines (e.g., connection lines cl1', cl2' and cl3') pass through a region between two adjacent bonding pins arranged in the x2-th row. Connection lines cl1', cl2' and cl3' in the second group are alternately in a first conductive layer and a second conductive layer, with a first connection line (connection line cl1') in the second group being in the second conductive layer Gate2.

Figure 3D:
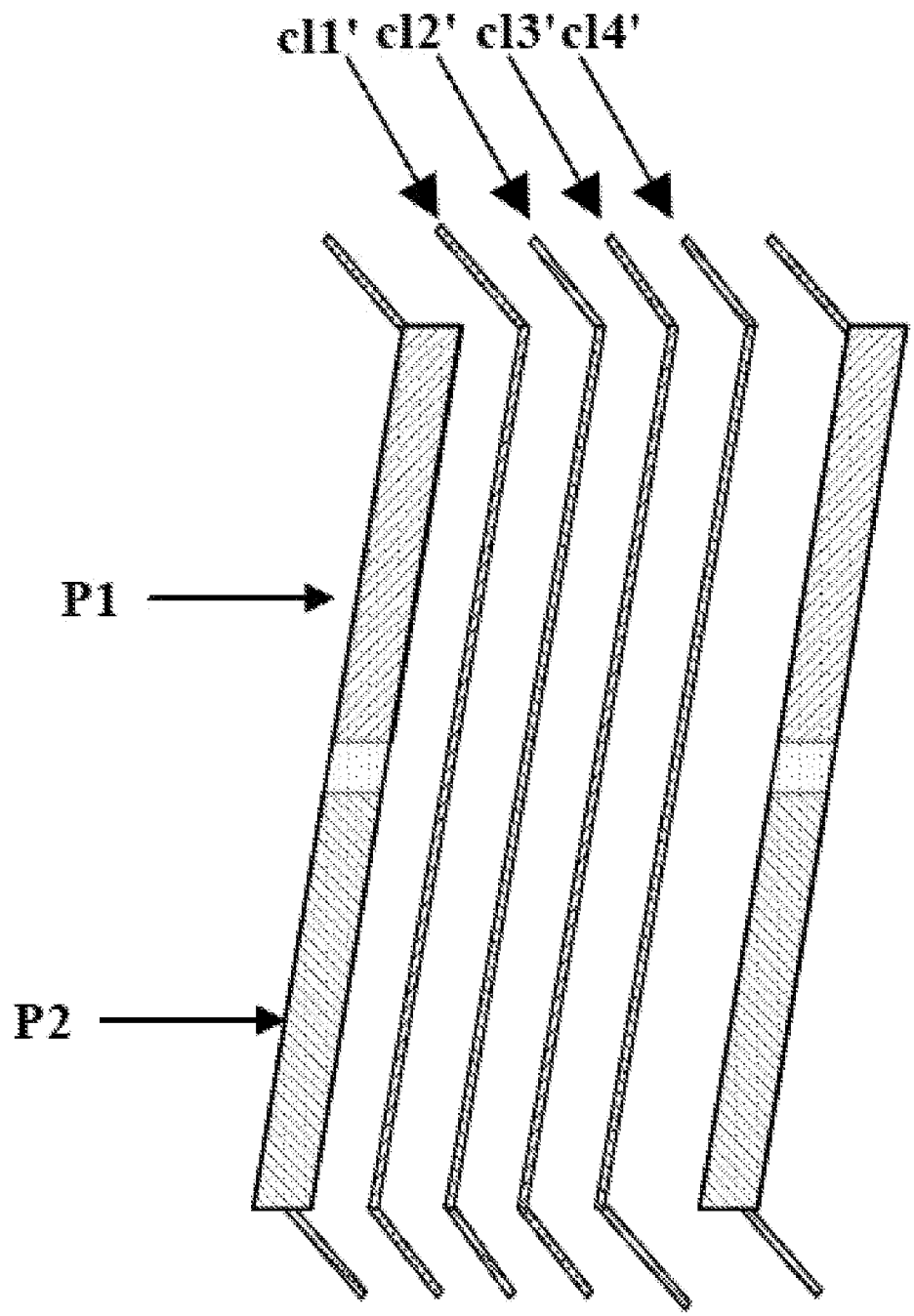
FIG. 3D is a zoom-in view of a fourth zoom-in region ZR4 in FIG. 3A.

FIG. 3D is a zoom-in view of a fourth zoom-in region ZR4 in FIG. 3A. Referring to FIG. 3C, FIG. 3D, FIG. 4A, and FIG. 4B, in some embodiments, the fourth zoom-in region ZR4 is in a x1 row (e.g., a fourth row), and the second zoom-in region ZR2 is in a x2 row (e.g., a third row), $x1=x2+1$. In the x1-th row (e.g., the fourth row) of the N rows, a first group of (N−1) number of connection lines (connection lines cl1', cl2', cl3', and cl4') pass through a region between two adjacent bonding pins arranged in the x1-th row. Connection lines cl1', cl2', cl3', and cl4' in the first group are alternately in a first conductive layer and a second conductive layer, with a first connection line (connection line cl1') in the first group being in the first conductive layer Gate1. In the x2-th row (e.g., the third row) of the N rows, a second group of (N−1) member of connection lines (e.g., connection lines cl1, cl2, cl3 and cl4) pass through a region between two adjacent bonding pins arranged in the x2-th row. Connection lines cl1, cl2, cl3 and cl4 in the second group are alternately in a first conductive layer and a second conductive layer, with a first connection line (connection line cl1) in the second group being in the second conductive layer Gate2.

In some embodiments, in at least a x-th row of the N rows, a x-th row bonding pin comprises at least a first sub-layer, 1≤x≤N, x being an integer. In at least a y-th row of the N rows, a y-th row bonding pin comprises at least a second sub-layer, 1≤y≤N, y being an integer different from x. The second sub-layer is absent in the x-th row bonding pin. The first sub-layer is absent in the y-th row bonding pin. The first sub-layer and the second sub-layer are in a first conductive layer and a second conductive layer, respectively. The display panel further comprising an insulating layer between the first conductive layer and the second conductive layer.

FIG. 5A is a cross-sectional view along an A-A' line in FIG. 2A. FIG. 5B is a cross-sectional view along a B-B' line in FIG. 2A. Referring to FIG. 2A and FIG. 5A, in at least a x-th row (e.g., the first row) of the N rows, a x-th row bonding pin (e.g., the first row bonding pin) includes at least a first sub-layer SUB1, 1≤x≤N, x being an integer. Referring to FIG. 2A and FIG. 5B, in at least a y-th row (e.g., the second row) of the N rows, a y-th row bonding pin (e.g., the second row bonding pin) includes at least a second sub-layer SUB2, 1≤y≤N, y being an integer different from x. The second sub-layer SUB2 is absent in the x-th row bonding pin (e.g., the first row bonding pin). The first sub-layer SUB1 is absent in the y-th row bonding pin (e.g., the second row bonding pin). Referring to FIG. 5A, FIG. 5B, FIG. 4A, and FIG. 4B, in some embodiments, the first sub-layer SUB1 is in the first conductive layer Gate1; and the second sub-layer SUB2 is in the second conductive layer Gate2. The display panel further includes an insulating layer IN between the first conductive layer Gate1 and the second conductive layer Gate2. In the embodiments depicted in FIG. 2A, FIG. 5A, and FIG. 5B, the x-th row (e.g., the first row) and the y-th row (e.g., the second row) are two adjacent rows. Optionally, the x-th row and the y-th row are any pair of two adjacent rows.

Optionally, as shown in FIG. 2A, FIG. 5A, and FIG. 5B, the x-th row is an odd numbered row, and the y-th row is an even numbered row.

Alternatively, the x-th row is an even numbered row, and the y-th row is an odd numbered row.

Referring to FIG. 5A, in some embodiments, the x-th row bonding pin further includes a third sub-layer SUB3 on a side of the first sub-layer SUB1 away from the base substrate BS, and in contact with the first sub-layer SUB1. Optionally, the x-th row bonding pin further includes a fourth sub-layer SUB4 on a side of the third sub-layer SUB3 away from the first sub-layer SUB1, and in contact with the third sub-layer SUB3. Referring to FIG. 5A, FIG. 4A, and FIG. 4B, in some embodiments, the first sub-layer SUB1 is in the first conductive layer Gate1; and the second sub-layer SUB2 is in the second conductive layer Gate2, the third sub-layer SUB3 is in a first signal line layer SLL1, and the fourth sub-layer SUB4 is in a touch electrode layer TE1. The display panel further includes an insulating layer IN between the first conductive layer Gate1 and the second conductive layer Gate2, an inter-layer dielectric layer ILD between the second conductive layer Gate2 and the first signal line layer SLL1, and at least a touch insulating layer TI between the touch electrode layer TE1 and the first signal line layer SLL1.

Referring to FIG. 5B, in some embodiments, the y-th row bonding pin further includes a third sub-layer SUB3 on a side of the second sub-layer SUB2 away from the base substrate BS, and in contact with the second sub-layer SUB2. Optionally, the y-th row bonding pin further includes a fourth sub-layer SUB4 on a side of the third sub-layer SUB3 away from the second sub-layer SUB2, and in contact with the third sub-layer SUB3. Referring to FIG. 5B, FIG. 4A, and FIG. 4B, in some embodiments, the first sub-layer SUB1 is in the first conductive layer Gate1; and the second sub-layer SUB2 is in the second conductive layer Gate2, the third sub-layer SUB3 is in a first signal line layer SLL1, and the fourth sub-layer SUB4 is in a touch electrode layer TE1. The display panel further includes an insulating layer IN between the first conductive layer Gate1 and the second conductive layer Gate2, an inter-layer dielectric layer ILD between the second conductive layer Gate2 and the first signal line layer SLL1, and at least a touch insulating layer TI between the touch electrode layer TE1 and the first signal line layer SLL1.

FIG. 6A is a cross-sectional view along a C-C' line in FIG. 3A. FIG. 6B is a cross-sectional view along a D-D' line in FIG. 3A. Referring to FIG. 3A and FIG. 6A, in at least a x-th row (e.g., the first row) of the N rows, a x-th row bonding pin (e.g., the first row bonding pin) includes at least a first sub-layer SUB1, 1≤x≤N, x being an integer. Referring to FIG. 3A and FIG. 6B, in at least a y-th row (e.g., the fifth row) of the N rows, a y-th row bonding pin (e.g., the fifth row bonding pin) includes at least a second sub-layer SUB2, 1≤y≤N, y being an integer different from x. The second sub-layer SUB2 is absent in the x-th row bonding pin (e.g., the first row bonding pin). The first sub-layer SUB1 is absent in the y-th row bonding pin (e.g., the fifth row bonding pin). Referring to FIG. 6A, FIG. 6B, FIG. 4A, and FIG. 4B, in some embodiments, the first sub-layer SUB1 is in the first conductive layer Gate1; and the second sub-layer SUB2 is in the second conductive layer Gate2. The display panel further includes an insulating layer IN between the first conductive layer Gate1 and the second conductive layer Gate2. In the embodiments depicted in FIG. 3A, FIG. 6A, and FIG. 6B, the x-th row (e.g., the first row) and the y-th row (e.g., the fifth row) are not adjacent rows, but spaced apart by at least another row.

Optionally, as shown in FIG. 3A, FIG. 6A, and FIG. 6B, the x-th row is an odd numbered row, and the y-th row is an odd numbered row.

Alternatively, the x-th row is an even numbered row, and the y-th row is an even numbered.

In some embodiments, in at least a z-th row, a z-th row bonding pin includes a first portion and a second portion along an extension direction of the z-th row bonding pin, 1≤z≤N, z being an integer. The first portion includes at least a first sub-layer. The second portion includes at least a second sub-layer. The second sub-layer is absent in the first portion. The first sub-layer is absent in the second portion. The first sub-layer and the second sub-layer are in a first conductive layer and a second conductive layer, respectively. The display panel further includes an insulating layer between the first conductive layer and the second conductive layer.

FIG. 6C is a cross-sectional view along a E-E' line in FIG. 3A. Referring to FIG. 3A and FIG. 6C, in at least a z-th row (e.g., the third row), a z-th row bonding pin (e.g., the third row bonding pin) includes a first portion P1 and a second portion P2 along an extension direction of the z-th row bonding pin. The first portion P1 includes at least a first sub-layer SUB1. The second portion P2 includes at least a second sub-layer SUB2. The second sub-layer SUB2 is absent in the first portion P1. The first sub-layer SUB1 is absent in the second portion P2. Referring to FIG. 6C, FIG. 4A, and FIG. 4B, in some embodiments, the first sub-layer SUB1 is in the first conductive layer Gate1; and the second sub-layer SUB2 is in the second conductive layer Gate2. The display panel further includes an insulating layer IN between the first conductive layer Gate1 and the second conductive layer Gate2.

In some embodiments, the z-th row bonding pin further includes at least a third sub-layer SUB3 in both the first portion P1 and the second portion P2. The third sub-layer SUB3 connects the first sub-layer SUB1 in the first portion P1 to the second sub-layer SUB2 in the second portion P2. Referring to FIG. 6C, FIG. 4A, and FIG. 4B, in some embodiments, the first sub-layer SUB1 is in the first conductive layer Gate1; and the second sub-layer SUB2 is in the second conductive layer Gate2, and the third sub-layer SUB3 is in a first signal line layer SLL1. The display panel further includes an insulating layer IN between the first conductive layer Gate1 and the second conductive layer Gate2, and an inter-layer dielectric layer ILD between the second conductive layer Gate2 and the first signal line layer SLL1.

In some embodiments, the z-th row bonding pin further includes a fourth sub-layer SUB4 in both the first portion P1 and the second portion P2. The fourth sub-layer SUB4 is on a side of the third sub-layer SUB3 away from the first sub-layer SUB1 and the second sub-layer SUB2, the fourth sub-layer SUB4 being in contact with the third sub-layer SUB3. Referring to FIG. 6C, FIG. 4A, and FIG. 4B, in one example, the first sub-layer SUB1 is in the first conductive layer Gate1; and the second sub-layer SUB2 is in the second conductive layer Gate2, the third sub-layer SUB3 is in a first signal line layer SLL1, and the fourth sub-layer SUB4 is in a touch electrode layer TE1. The display panel further includes an insulating layer IN between the first conductive layer Gate1 and the second conductive layer Gate2, an inter-layer dielectric layer ILD between the second conductive layer Gate2 and the first signal line layer SLL1, and at least a touch insulating layer TI between the touch electrode layer TE1 and the first signal line layer SLL1.

Referring to FIG. 6C, FIG. 4A, and FIG. 4B, in another example, the first sub-layer SUB1 is in the first conductive layer Gate1; and the second sub-layer SUB2 is in the second conductive layer Gate2, the third sub-layer SUB3 is in a first signal line layer SLL1, and the fourth sub-layer SUB4 is in a same layer as the plurality of second electrode bridges BR2. The display panel further includes an insulating layer IN between the first conductive layer Gate1 and the second conductive layer Gate2, an inter-layer dielectric layer ILD between the second conductive layer Gate2 and the first signal line layer SLL1, and at least a buffer layer BUF between the plurality of second electrode bridges BR2 and the first signal line layer SLL1.

In some embodiments, the z-th row is a row other than a first row and a N-th row. Referring to FIG. 3A, the z-th row may be any one of a second row, a third row, or a fourth row.

In some embodiments, in at least a z-th row, a z-th row bonding pin includes a first portion and a second portion along an extension direction of the z-th row bonding pin, $1 \leq z \leq N$, z being an integer. In a first adjacent row, a first adjacent row bonding pin includes at least a first adjacent portion adjacent to the first portion. In a second adjacent row, a second adjacent row bonding pin comprises at least a second adjacent portion adjacent to the second portion. The first portion is in a same layer as the first adjacent portion and in a different layer from the second portion and the second adjacent portion. The second portion is a same layer as the second adjacent portion and in a different layer from the first portion and the first adjacent portion.

In some embodiments, the first adjacent row is a (z−1)-th row, and the second adjacent row is a (z+1)-th row. In the z-th row, a z-th row bonding pin includes a first portion and a second portion along an extension direction of the z-th row bonding pin, $1 \leq z \leq N$, z being an integer. In a (z−1)-th row, a (z−1)-th row bonding pin includes at least a first adjacent portion adjacent to the first portion. In a (z+1)-th row, a (z+1)-th row bonding pin comprises at least a second adjacent portion adjacent to the second portion. The first portion is in a same layer as the first adjacent portion and in a different layer from the second portion and the second adjacent portion. The second portion is a same layer as the second adjacent portion and in a different layer from the first portion and the first adjacent portion.

Figure 7A:
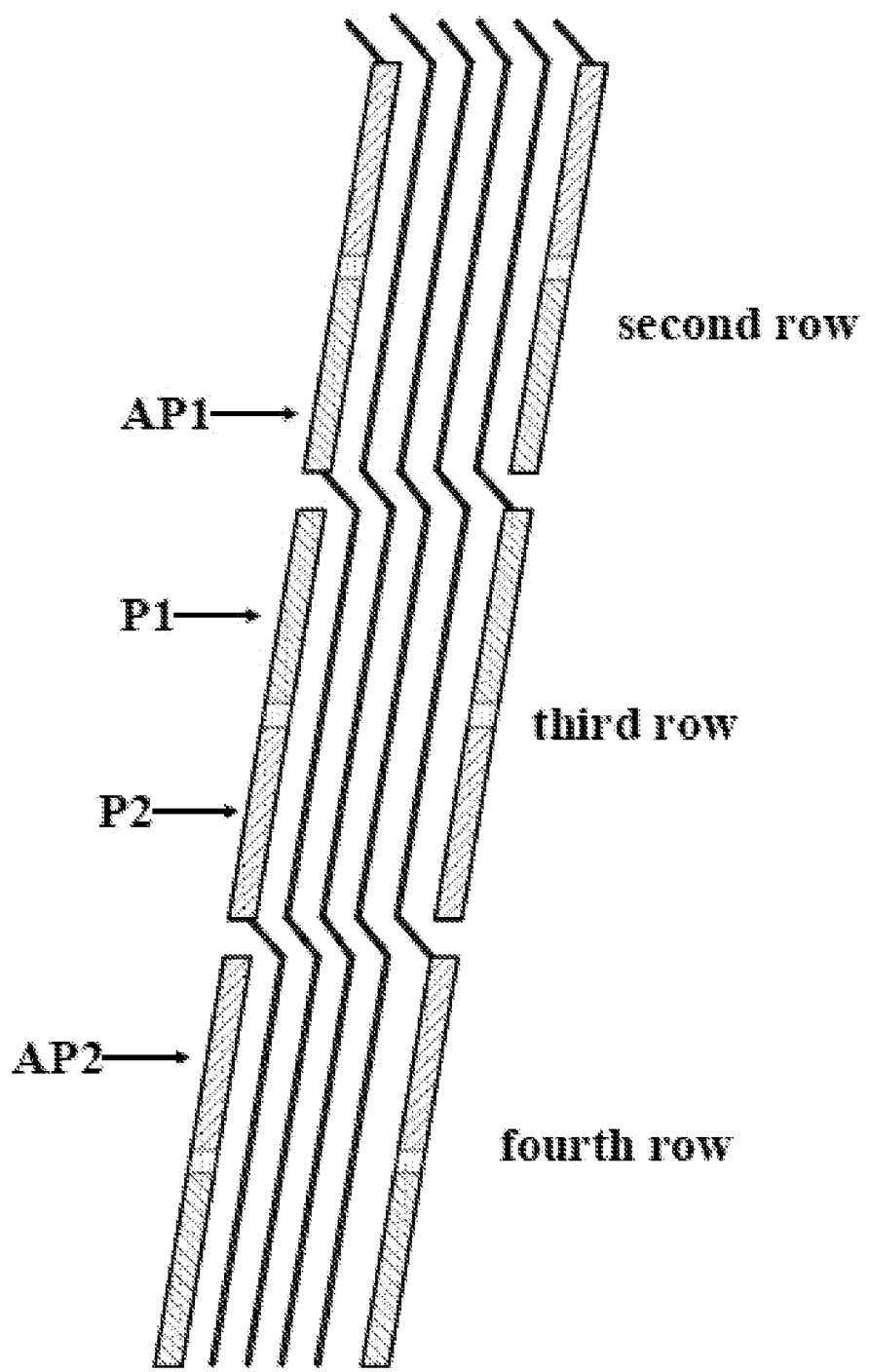
FIG. 7A illustrates bonding pins in three consecutive rows of bonding pins in some embodiments according to the present disclosure.

FIG. 7A illustrates bonding pins in three consecutive rows of bonding pins in some embodiments according to the present disclosure. Referring to FIG. 7A, in the third row (the z-th row) of the N rows of bonding pins, a third row bonding pin includes a first portion P1 and a second portion P2 along an extension direction of the third row bonding pin. In the second row (the (z−1) row) of the N rows of bonding pins, a second row bonding pin includes at least a first adjacent portion AP1 adjacent to the first portion P1. In the fourth row (the (z+1)-th row) of the N rows of bonding pins, a fourth row bonding pin includes at least a second adjacent portion AP2 adjacent to the second portion P2. In some embodiments, the first portion P1 is in a same layer as the first adjacent portion AP1, and in a different layer from the second portion P2 and the second adjacent portion AP2. In some embodiments, the second portion P2 is in a same layer as the second adjacent portion AP2, and in a different layer from the first portion P1 and the first adjacent portion AP1. As shown in FIG. 7A, the first adjacent portion AP1 is a first portion of the second row bonding pin, and the second adjacent portion AP2 is a second portion of the fourth row bonding pin.

In some embodiments, the first adjacent row is a (z+1)-th row, and the second adjacent row is a (z−1)-th row. In the z-th row, a z-th row bonding pin includes a first portion and a second portion along an extension direction of the z-th row bonding pin, $1 \leq z \leq N$, z being an integer. In a (z+1)-th row, a (z+1)-th row bonding pin includes at least a first adjacent portion adjacent to the first portion. In a (z−1)-th row, a (z−1)-th row bonding pin includes at least a second adjacent portion adjacent to the second portion. The first portion is in a same layer as the first adjacent portion and in a different layer from the second portion and the second adjacent portion. The second portion is a same layer as the second adjacent portion and in a different layer from the first portion and the first adjacent portion.

Figure 7B:
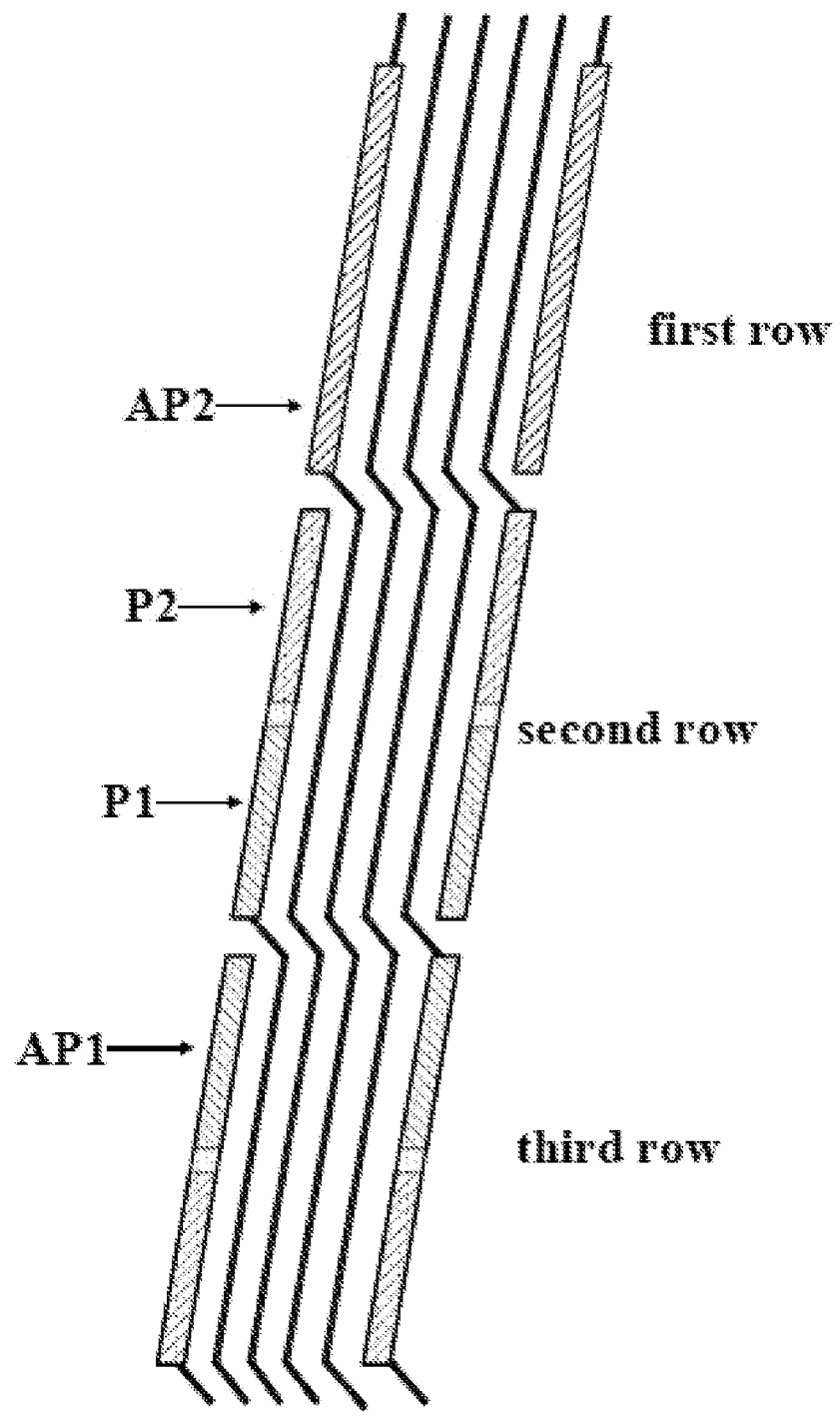
FIG. 7B illustrates bonding pins in three consecutive rows of bonding pins in some embodiments according to the present disclosure.

FIG. 7B illustrates bonding pins in three consecutive rows of bonding pins in some embodiments according to the present disclosure. Referring to FIG. 7B, in the second row (the z-th row) of the N rows of bonding pins, a second row bonding pin includes a first portion P1 and a second portion P1 along an extension direction of the second row bonding pin. In the third row (the (z+1)-th row) of the N rows of bonding pins, a third row bonding pin includes at least a first adjacent portion AP1 adjacent to the first portion P1. In the first row (the (z−1)-th row) of the N rows of bonding pins, a first row bonding pin includes at least a second adjacent portion AP2 adjacent to the second portion P2. In some embodiments, the first portion P1 is in a same layer as the first adjacent portion AP1, and in a different layer from the second portion P2 and the second adjacent portion AP2. In some embodiments, the second portion P2 is in a same layer as the second adjacent portion AP2, and in a different layer from the first portion P1 and the first adjacent portion AP1. As shown in FIG. 7B, the first adjacent portion AP1 is a first portion of the third row bonding pin, and the second adjacent portion AP2 is any portion of the first row bonding pin.

Figure 8A:
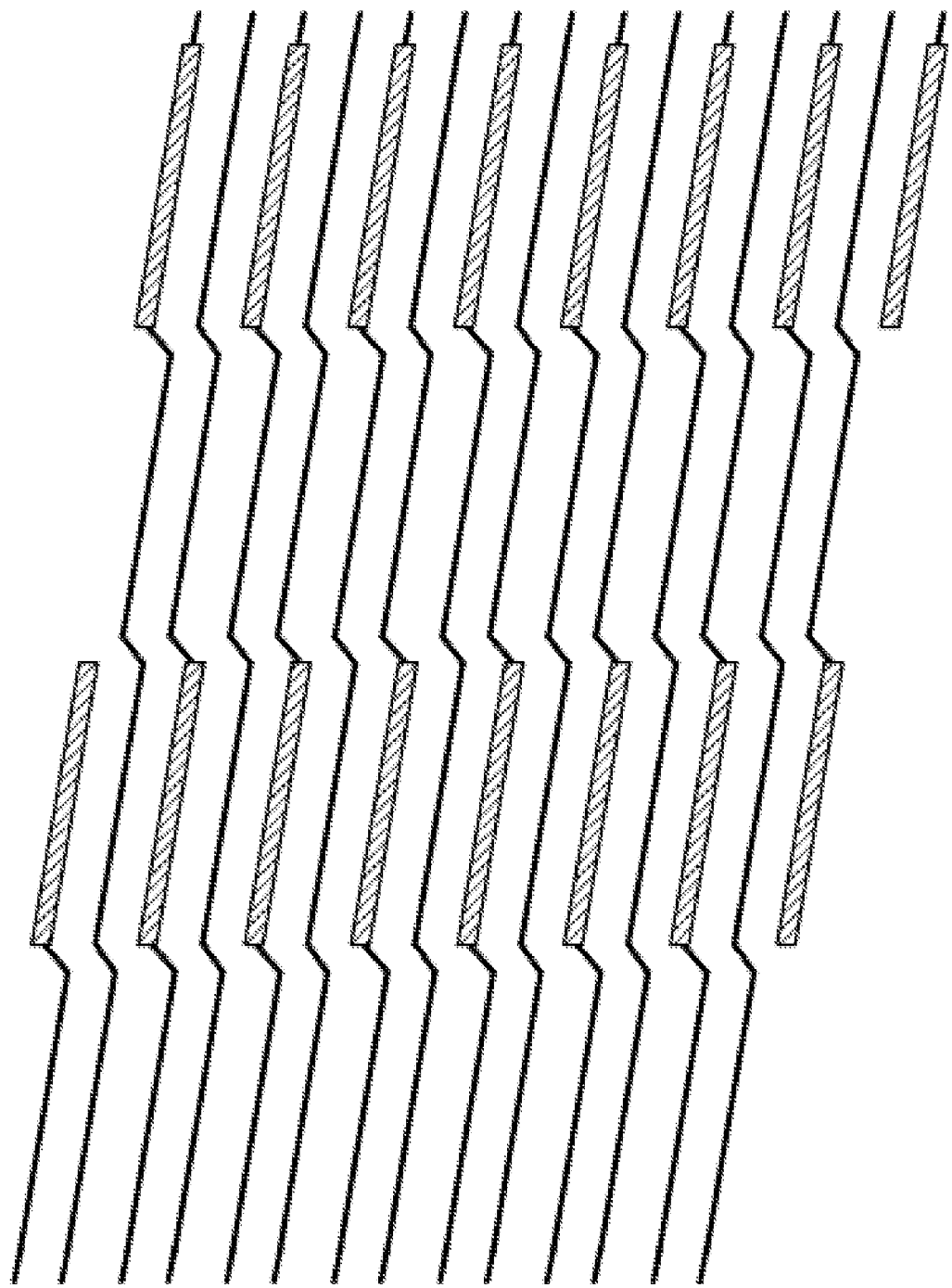
FIG. 8A illustrate a first sub-layer of a plurality of bonding pin structures in FIG. 2A.
Figure 8B:
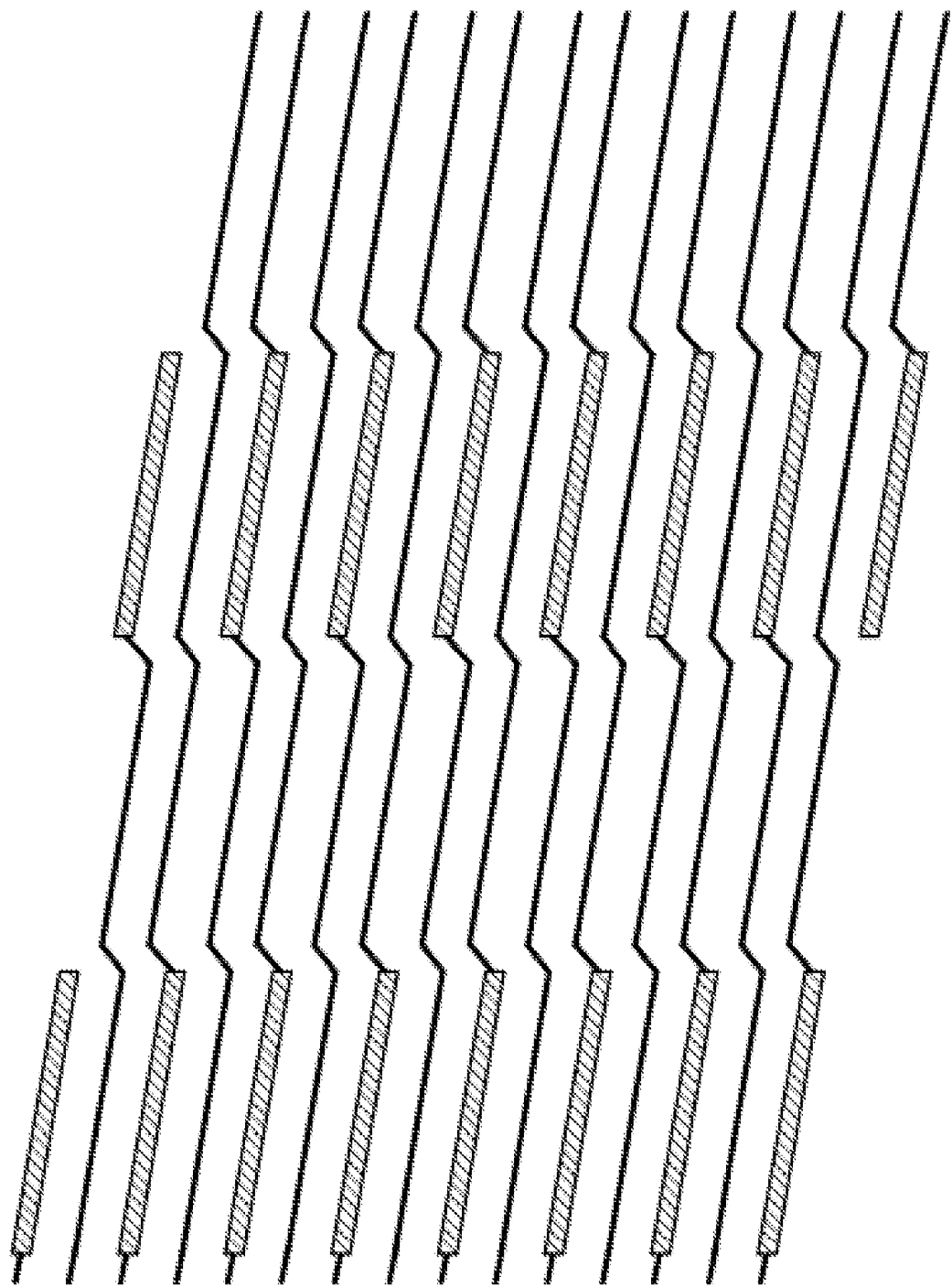
FIG. 8B illustrate a second sub-layer of a plurality of bonding pin structures in FIG. 2A.
Figure 8C:
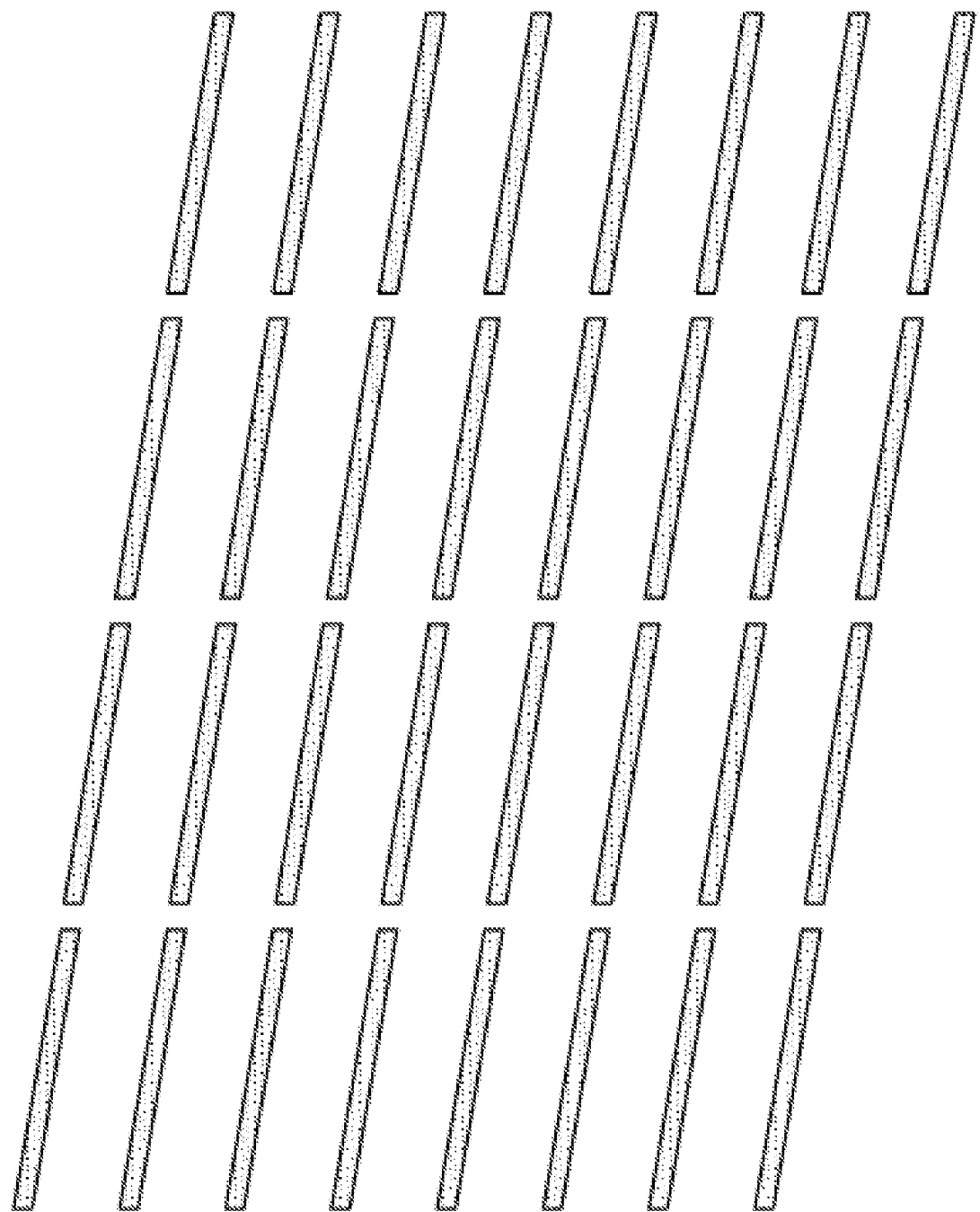
FIG. 8C illustrate a third sub-layer of a plurality of bonding pin structures in FIG. 2A.
Figure 8D:
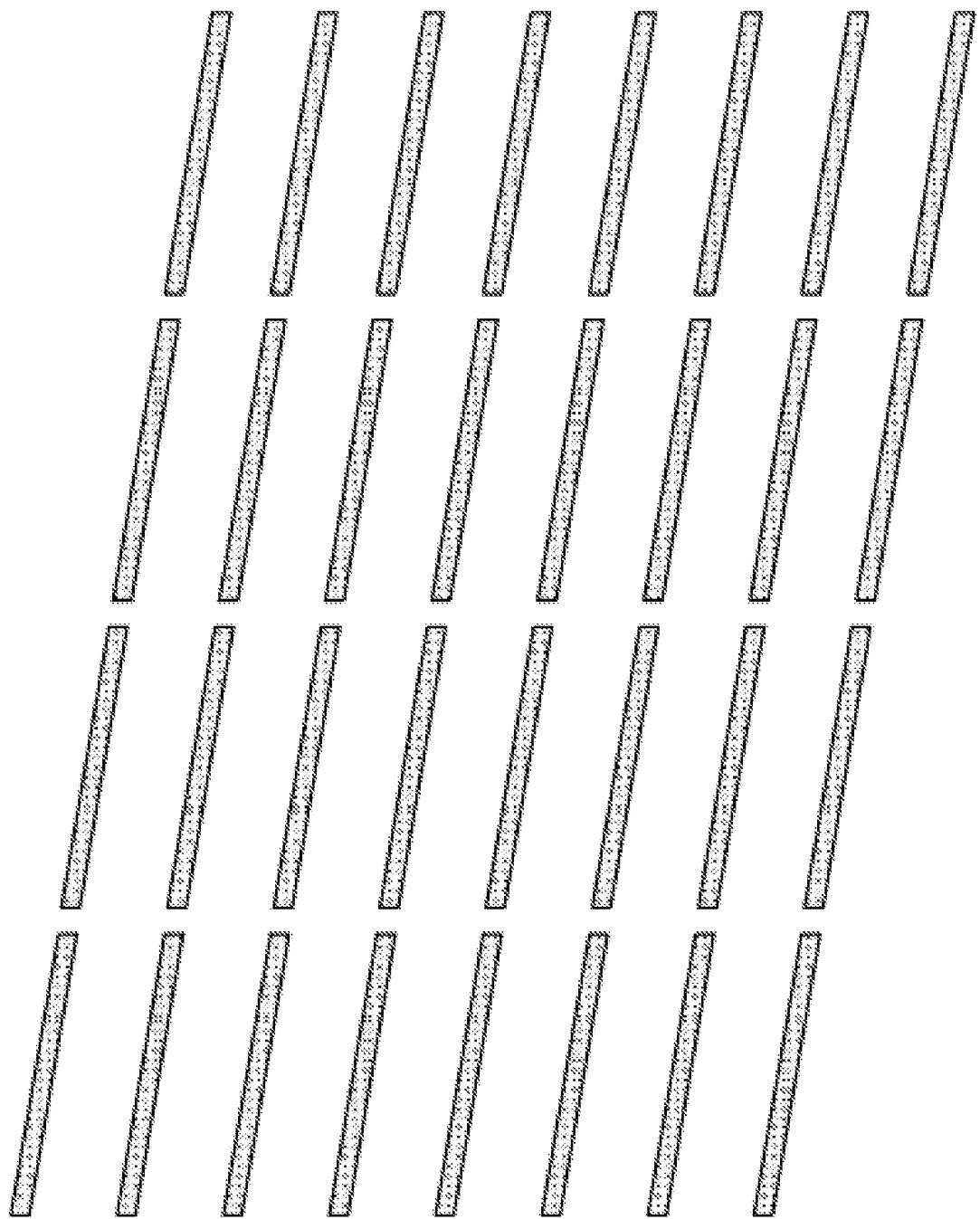
FIG. 8D illustrate a fourth sub-layer of a plurality of bonding pin structures in FIG. 2A.

FIG. 8A illustrate a first sub-layer of a plurality of bonding pin structures in FIG. 2A. The first sub-layer in FIG. 8A is in the first conductive layer Gate1 in FIG. 4A and FIG. 4B. FIG. 8B illustrate a second sub-layer of a plurality of bonding pin structures in FIG. 2A. The second sub-layer in FIG. 8B is in the second conductive layer Gate2 in FIG. 4A and FIG. 4B. FIG. 8C illustrate a third sub-layer of a plurality of bonding pin structures in FIG. 2A. The third sub-layer in FIG. 8C is in the first signal line layer SLL1 in FIG. 4A and FIG. 4B. FIG. 8D illustrate a fourth sub-layer of a plurality of bonding pin structures in FIG. 2A. The fourth sub-layer in FIG. 8D is in the touch electrode layer TE1 in FIG. 4A and FIG. 4B.

Figure 9A:
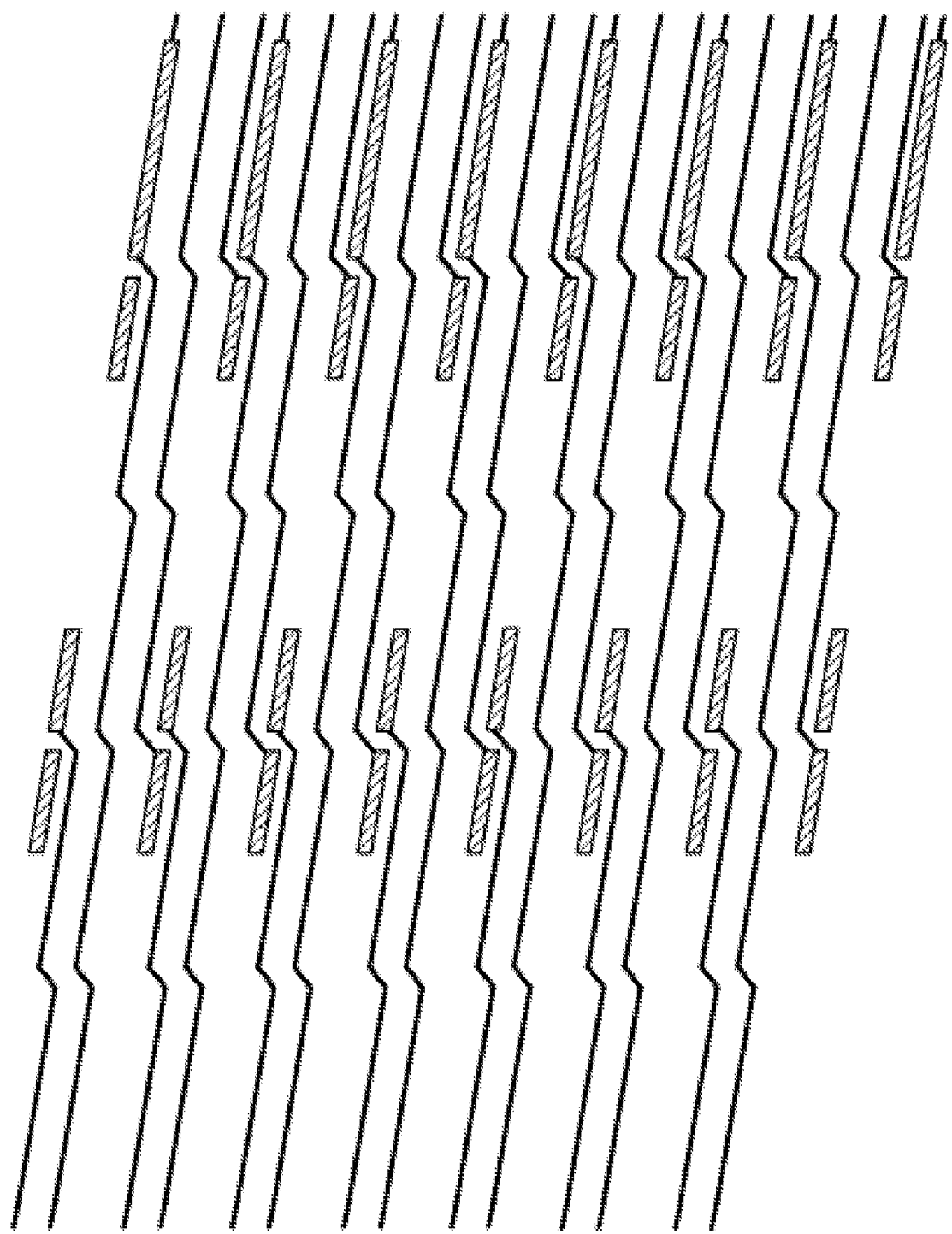
FIG. 9A illustrate a first sub-layer of a plurality of bonding pin structures in FIG. 3A.
Figure 9B:
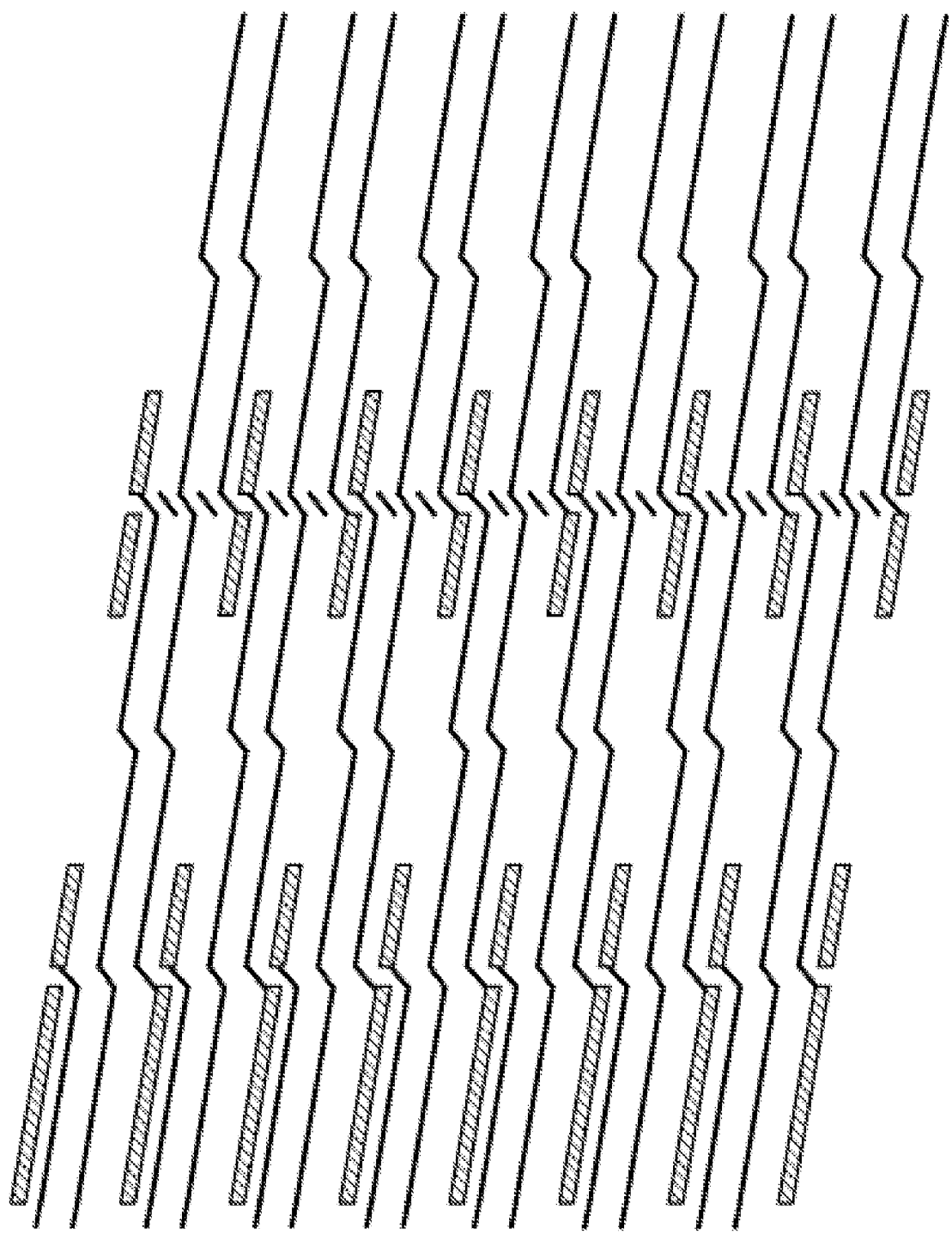
FIG. 9B illustrate a second sub-layer of a plurality of bonding pin structures in FIG. 3A.
Figure 9C:
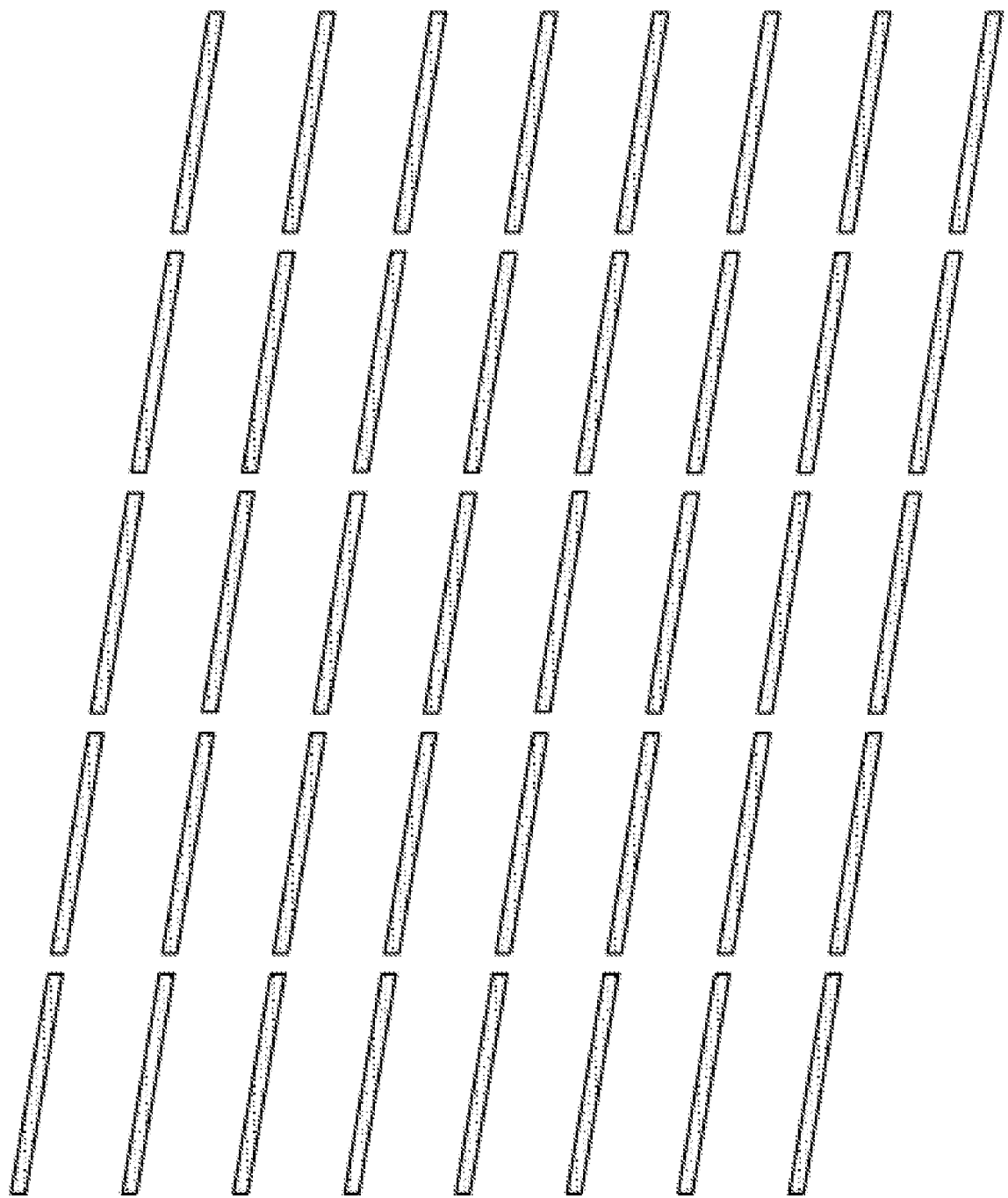
FIG. 9C illustrate a third sub-layer of a plurality of bonding pin structures in FIG. 3A.
Figure 9D:
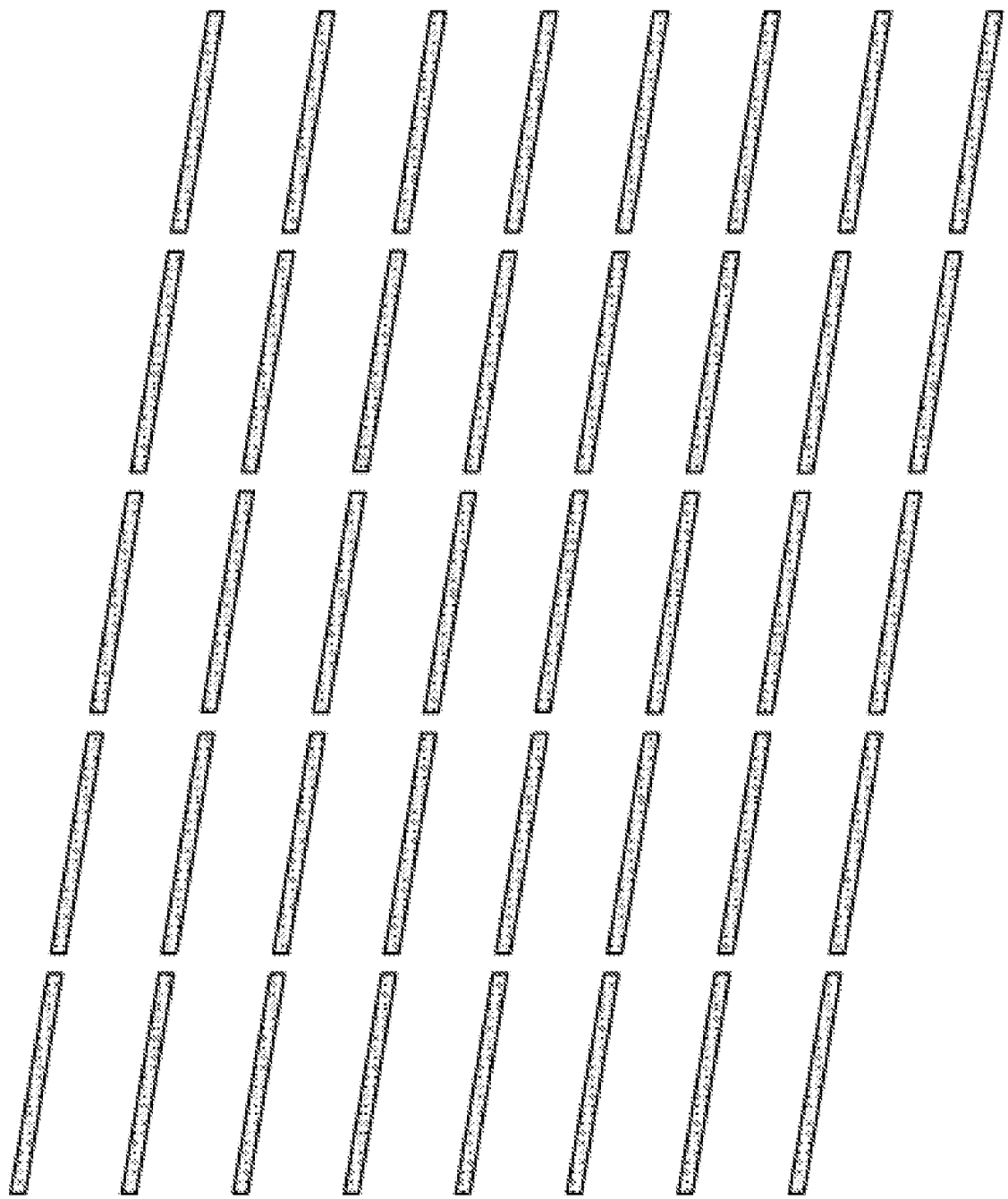
FIG. 9D illustrate a fourth sub-layer of a plurality of bonding pin structures in FIG. 3A.

FIG. 9A illustrate a first sub-layer of a plurality of bonding pin structures in FIG. 3A. The first sub-layer in FIG. 9A is in the first conductive layer Gate1 in FIG. 4A and FIG. 4B. FIG. 9B illustrate a second sub-layer of a plurality of bonding pin structures in FIG. 3A. The second sub-layer in FIG. 9B is in the second conductive layer Gate2 in FIG. 4B. FIG. 9C illustrate a third sub-layer of a plurality of bonding pin structures in FIG. 3A. The third sub-layer in FIG. 9C is in the first signal line layer SLL1 in FIG. 4B. FIG. 9D illustrate a fourth sub-layer of a plurality of bonding pin structures in FIG. 3A. The fourth sub-layer in FIG. 9D is in the touch electrode layer TE1 in FIG. 4B.

Referring to FIG. 2A, FIG. 2C, FIG. 2D, and FIG. 5A to FIG. 8D, in some embodiments, N is an even number (e.g., N=4). In some embodiments, in a group of (N−1) number of connection lines between two adjacent i-th row bonding pins in a i-th row of the N rows, a first connection line and a (N−1)-th connection line are in a same layer, $1 \leq i \leq N$, i being an integer, and the two adjacent i-th row bonding pins comprise a sub-layer in a different layer from the first connection line and the (N−1)-th connection line, and in a same layer as a second connection line or a (N−2)-th connection line. For example, referring to FIG. 2C, connection line cl1 (the first connection line) and connection line cl3 (the (N−1)-th connection line) are in a same layer (e.g., in the first sub-layer SUB1), and the two adjacent second row bonding pins includes a second sub-layer SUB2 in a different layer from connection line cl1 and connection line cl3. In another example, referring to FIG. 2D, connection line cl1' (the first connection line) and connection line cl3' (the (N−1)-th connection line) are in a same layer (e.g., in the second sub-layer SUB2), and the two adjacent third row bonding pins includes a first sub-layer SUB1 in a different layer from connection line cl1' and connection line cl3'.

Figure 3E:
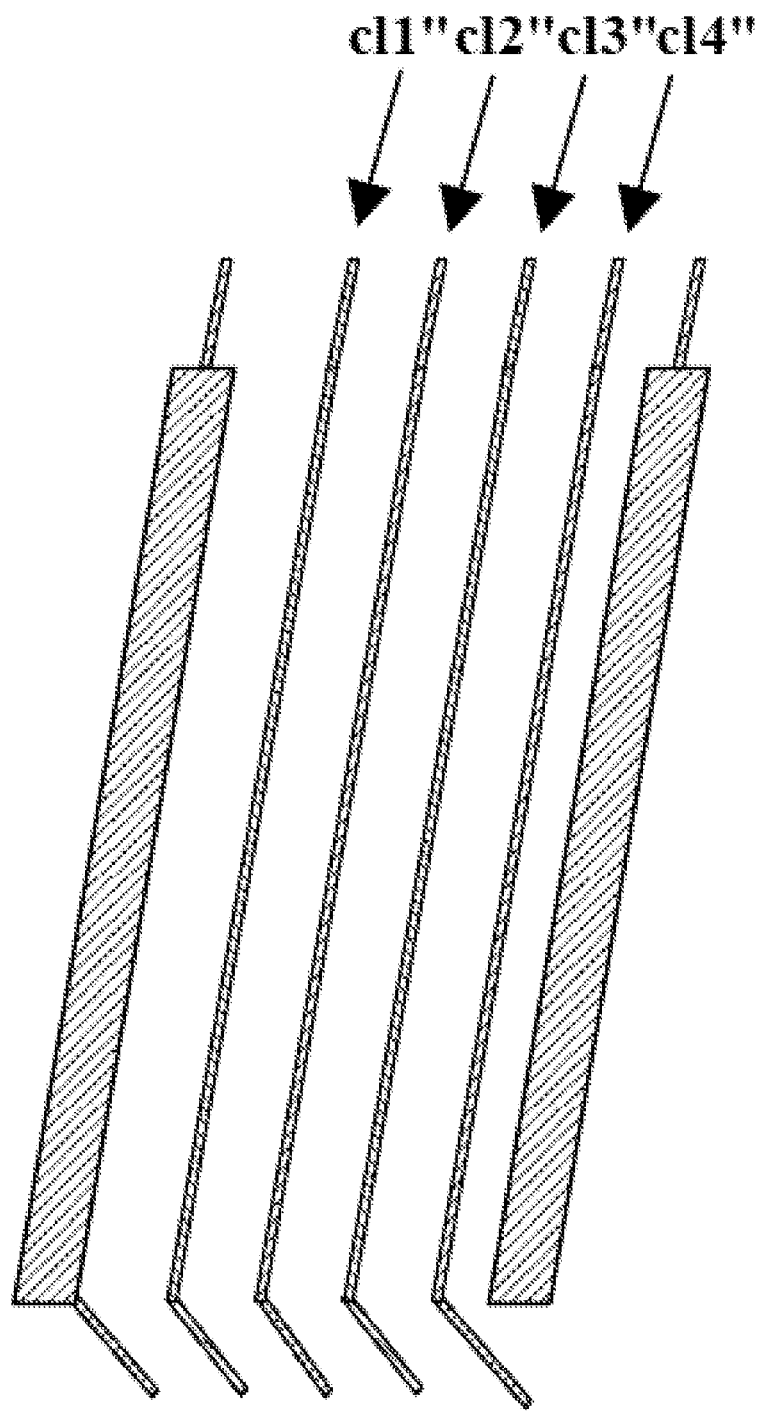
FIG. 3E is a zoom-in view of a fifth zoom-in region ZR5 in FIG. 3A.
Figure 3F:
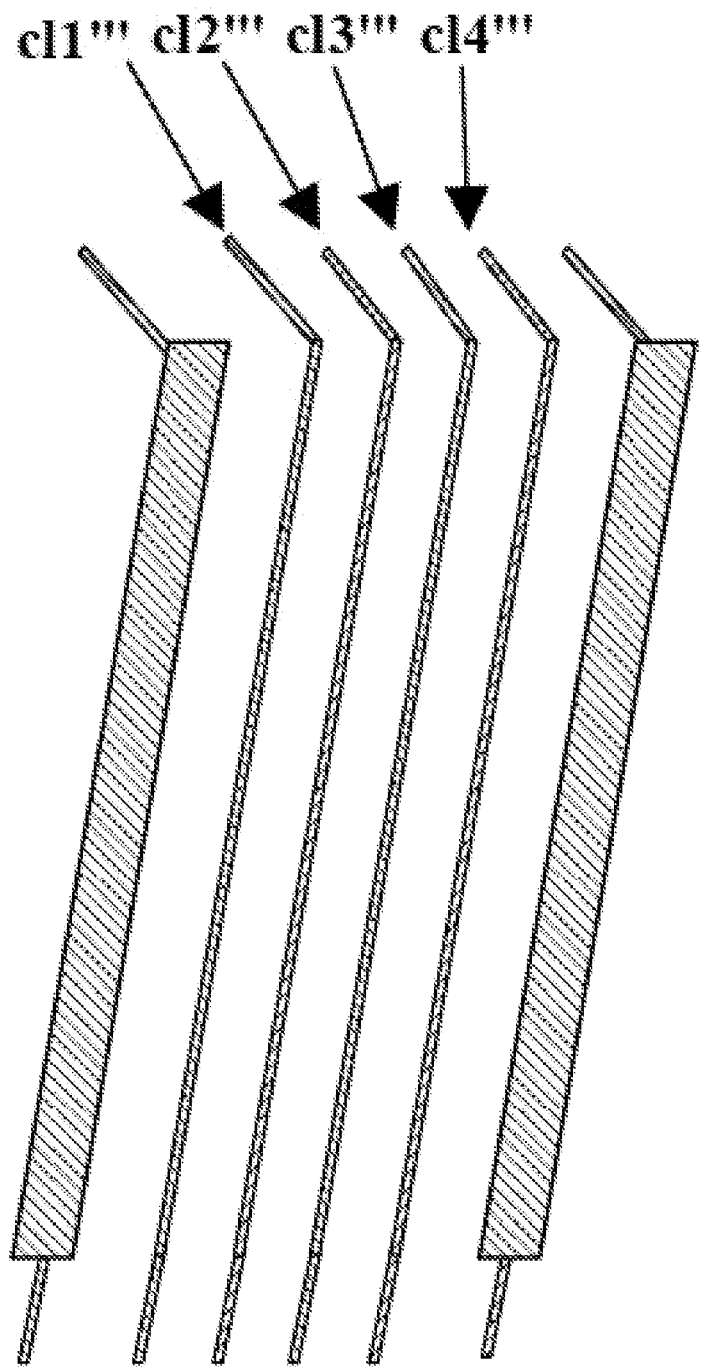
FIG. 3F is a zoom-in view of a sixth zoom-in region ZR6 in FIG. 3A.

FIG. 3E is a zoom-in view of a fifth zoom-in region ZR5 in FIG. 3A. FIG. 3F is a zoom-in view of a sixth zoom-in region ZR6 in FIG. 3A. Referring to FIG. 3A, FIG. 3E, FIG. 3F, and FIG. 9A to FIG. 9D, in some embodiments, N is an odd number (e.g., N=5). In some embodiments, in a group of (N−1) number of connection lines between two adjacent i-th row bonding pins in a i-th row of the N rows, a first connection line and a (N−1)-th connection line are in different layers, $1 \leq i \leq N$, i being an integer. For example, referring to FIG. 3E, connection line cl1" (the first connection line) and connection line cl4" (the (N−1)-th connection line) are in different layers. In another example, referring to FIG. 3F, connection line cl1''' (the first connection line) and connection line cl4''' (the (N−1)-th connection line) are in different layers.

In some embodiments, a first adjacent i-th row bonding pin includes a sub-layer in a different layer from the first connection line; and a second adjacent i-th row bonding pin includes a sub-layer in a same layer as the (N−1)-th connection line. Referring to FIG. 3E, the bonding pin on the left side (the first adjacent i-th row bonding pin) includes a first sub-layer in a different layer from connection line cl" (the first connection line); and the bonding pin on the right side (the second adjacent i-th row bonding pin) includes a first sub-layer in a same layer as connection line cl4" (the (N−1)-th connection line). Optionally, i=1; the i-th row is the first row.

In some embodiments, a first adjacent i-th row bonding pin comprises a sub-layer in a same layer as the first connection line; and a second adjacent i-th row bonding pin comprises a sub-layer in a different layer from the (N−1)-th connection line. Referring to FIG. 3F, the bonding pin on the left side (the first adjacent i-th row bonding pin) includes a second sub-layer in a same layer as connection line cl1''' (the first connection line); and the bonding pin on the right side (the second adjacent i-th row bonding pin) includes a second sub-layer in a different layer from connection line cl4''' (the (N−1)-th connection line). Optionally, i=N; the i-th row is the N-th row.

In some embodiments, in at least a z-th row, a z-th row bonding pin includes a first portion and a second portion along an extension direction of the z-th row bonding pin, $1 \leq z \leq N$, z being an integer. In a group of (N−1) number of connection lines between two adjacent z-th row bonding pins in the z-th row, a first connection line and a (N−1)-th connection line are in different layers. The first connection line is in a same layer as the first portion and in a different layer from the second portion and the (N−1)-th connection line. The (N−1)-th connection line is in a same layer as the second portion and in a different layer from the first portion and the first connection line.

Referring to FIG. 3D, in a fourth row, a fourth row bonding pin includes a first portion P1 and a second portion P2 along an extension direction of the fourth row bonding pin. Connection line cl1' (the first connection line) is in a same layer as the first portion P1 and in a different layer from the second portion P2 and connection line cl4' (the (N−1)-th connection line). Connection line cl1' (the (N−1)-th connection line) is in a same layer as the second portion P2 and in a different layer from the first portion P1 and connection line cl1' (the first connection line).

In some embodiments, in at least a z-th row, a z-th row bonding pin includes a first portion and a second portion along an extension direction of the z-th row bonding pin, $1 \leq z \leq N$, z being an integer. In a group of (N−1) number of connection lines between two adjacent z-th row bonding pins in the z-th row, a first connection line and a (N−1)-th connection line are in different layers, the first connection line is in a same layer as the second portion and in a different layer from the first portion and the (N−1)-th connection line.

The (N−1)-th connection line is in a same layer as the first portion and in a different layer from the second portion and the first connection line.

Referring to FIG. 3C, in a third row, a third row bonding pin includes a first portion P1 and a second portion P2 along an extension direction of the third row bonding pin. Connection line cl1 (the first connection line) is in a same layer as the second portion P2 and in a different layer from the first portion P1 and connection line cl4 (the (N−1)-th connection line). Connection line cl4 (the (N−1)-th connection line) is in a same layer as the first portion P1 and in a different layer from the second portion P2 and connection line cl1 (the first connection line).

In the present display panel, connection lines and at least certain sub-layers of certain bonding pins are arranged in two different layers, effectively obviating short between adjacent connection lines and between connection line and bonding pin. The layout of the bonding pin structures in the present display panel effectively allows a higher density of bonding pins and connection lines to be arranged in a same unit area, thus reducing a total number of integrated circuits needed for the display panel.

In another aspect, the present disclosure provides a display apparatus including a display panel described herein and one or more integrated circuit bonded to the plurality of bonding pin structures in the bonding region of the display panel. Optionally, the display apparatus is an organic light emitting diode display apparatus. Optionally, the display apparatus is an electrophoretic display apparatus. Optionally, the display apparatus is a liquid crystal display apparatus. Examples of appropriate display apparatuses include, but are not limited to, an electronic paper, a mobile phone, a tablet computer, a television, a monitor, a notebook computer, a digital album, a GPS, etc.

In another aspect, the present invention provides a method of fabricating a display panel. In some embodiments, the method include forming a plurality of bonding pin structures on a base substrate and in a bonding region for bonding an integrated circuit. The plurality of bonding pin structures are formed in a plurality of columns, respectively. Optionally, forming a respective bonding pin structure includes forming a respective bonding pin and connection lines on two ends of the respective bonding pin, respectively, bonding pins of the plurality of bonding pin structures are arranged in N rows, N is a positive integer equal to or greater than 4. (N−1) number of connection lines pass through a region between two adjacent bonding pins arranged in a same row.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, having a bonding region for bonding an integrated circuit, comprising:
 a base substrate; and
 a plurality of bonding pin structures on the base substrate arranged in a plurality of columns, respectively;
 wherein a respective bonding pin structure comprises a respective bonding pin and connection lines on two ends of the respective bonding pin, respectively;
 bonding pins of the plurality of bonding pin structures are arranged in N rows, N is a positive integer equal to or greater than 4; and
 (N−1) number of connection lines pass through a region between two adjacent bonding pins arranged in a same row.

2. The display panel of claim 1, wherein at least two adjacent connection lines of the (N−1) number of connection lines between the two adjacent bonding pins arranged in a same row are in two different layers.

3. The display panel of claim 2, wherein the two adjacent connection lines are in a first conductive layer and a second conductive layer, respectively; and
 the display panel further comprising an insulating layer between the first conductive layer and the second conductive layer.

4. The display panel of claim 3, wherein the (N−1) number of connection lines between the two adjacent bonding pins arranged in a same row are alternately in the first conductive layer and the second conductive layer.

5. The display panel of claim 1, wherein, in a x1-th row of the N rows, a first group of (N−1) number of connection lines pass through a region between two adjacent bonding pins arranged in the x1-th row, 1≤x1≤N, x1 being an integer;
 in a x2-th row of the N rows, a second group of (N−1) number of connection lines pass through a region between two adjacent bonding pins arranged in the x2-th row, 1≤x2≤N, x2 being an integer different from x1;
 the (N−1) number of connection lines in the first group are alternately in a first conductive layer and a second conductive layer, with a first connection line in the first group being in the first conductive layer;
 the (N−1) number of connection lines in the second group are alternately in the first conductive layer and the second conductive layer, with a first connection line in the second group being in the second conductive layer; and $$x2 = x1 + 1, \text{ or } x1 = x2 + 1.$$

6. The display panel of claim 1, wherein, in at least a x-th row of the N rows, a x-th row bonding pin comprises at least a first sub-layer, $1 \leq x \leq N$, x being an integer;
   in at least a y-th row of the N rows, a y-th row bonding pin comprises at least a second sub-layer, $1 \leq y \leq N$, y being an integer different from x;
   the second sub-layer is absent in the x-th row bonding pin;
   the first sub-layer is absent in the y-th row bonding pin;
   the first sub-layer and the second sub-layer are in a first conductive layer and a second conductive layer, respectively; and
   the display panel further comprises an insulating layer between the first conductive layer and the second conductive layer.

7. The display panel of claim 6, wherein the x-th row and the y-th row are two adjacent rows.

8. The display panel of claim 1, wherein, in at least a z-th row, a z-th row bonding pin comprises a first portion and a second portion along an extension direction of the z-th row bonding pin, $1 \leq z \leq N$, z being an integer;
   the first portion comprises at least a first sub-layer;
   the second portion comprises at least a second sub-layer;
   the second sub-layer is absent in the first portion;
   the first sub-layer is absent in the second portion;
   the first sub-layer and the second sub-layer are in a first conductive layer and a second conductive layer, respectively; and
   the display panel further comprises an insulating layer between the first conductive layer and the second conductive layer.

9. The display panel of claim 8, wherein the z-th row bonding pin further comprises at least a third sub-layer in both the first portion and the second portion;
   wherein the third sub-layer connects the first sub-layer in the first portion to the second sub-layer in the second portion;
   the third sub-layer is in a first signal line layer; and
   the display panel further comprising an inter-layer dielectric layer between the second conductive layer and the first signal line layer.

10. The display panel of claim 9, wherein the z-th row bonding pin further comprises a fourth sub-layer in both the first portion and the second portion;
    wherein the fourth sub-layer is on a side of the third sub-layer away from the first sub-layer and the second sub-layer, the fourth sub-layer being in contact with the third sub-layer;
    the fourth sub-layer is in a touch electrode layer; and
    the display panel further comprising at least a touch insulating layer between the touch electrode layer and the first signal line layer.

11. The display panel of claim 10, wherein the z-th row is a row other than a first row and a N-th row.

12. The display panel of claim 1, wherein, in at least a z-th row, a z-th row bonding pin comprises a first portion and a second portion along an extension direction of the z-th row bonding pin, $1 \leq z \leq N$, z being an integer;
    in a first adjacent row, a first adjacent row bonding pin comprises at least a first adjacent portion adjacent to the first portion;
    in a second adjacent row, a second adjacent row bonding pin comprises at least a second adjacent portion adjacent to the second portion;
    the first portion is in a same layer as the first adjacent portion and in a different layer from the second portion and the second adjacent portion; and
    the second portion is in a same layer as the second adjacent portion and in a different layer from the first portion and the first adjacent portion.

13. The display panel of claim 1, wherein N is an even number;
    in a group of (N−1) number of connection lines between two adjacent i-th row bonding pins in a i-th row of the N rows, a first connection line and a (N−1)-th connection line are in a same layer, $1 \leq i \leq N$, i being an integer; and
    the two adjacent i-th row bonding pins comprise a sub-layer in a different layer from the first connection line and the (N−1)-th connection line, and in a same layer as a second connection line or a (N−2)-th connection line.

14. The display panel of claim 1, wherein N is an odd number;
    in a group of (N−1) number of connection lines between two adjacent i-th row bonding pins in a i-th row of the N rows, a first connection line and a (N−1)-th connection line are in different layers, $1 \leq i \leq N$, i being an integer.

15. The display panel of claim 14, wherein i=1 or i=N.

16. The display panel of claim 1, wherein, in at least a z-th row, a z-th row bonding pin comprises a first portion and a second portion along an extension direction of the z-th row bonding pin, $1 \leq z \leq N$, z being an integer; and
    in a group of (N−1) number of connection lines between two adjacent z-th row bonding pins in the z-th row, a first connection line and a (N−1)-th connection line are in different layers.

17. The display panel of claim 16, wherein the first connection line is in a same layer as the first portion and in a different layer from the second portion and the (N−1)-th connection line; and
    the (N−1)-th connection line is in a same layer as the second portion and in a different layer from the first portion and the first connection line.

18. The display panel of claim 16, wherein the first connection line is in a same layer as the second portion and in a different layer from the first portion and the (N−1)-th connection line; and
    the (N−1)-th connection line is in a same layer as the first portion and in a different layer from the second portion and the first connection line.

19. The display panel of claim 1, wherein N=5.

20. A display apparatus, comprising the display panel of claim 1, and one or more integrated circuit bonded to the plurality of bonding pin structures in the bonding region of the display panel.

* * * * *